(12) United States Patent
Fujii et al.

(10) Patent No.: US 8,936,839 B2
(45) Date of Patent: Jan. 20, 2015

(54) DISPLAY PANEL WITH FLAT PLATE, METHOD FOR MANUFACTURING DISPLAY PANEL WITH FLAT PLATE, AND RESIN COMPOSITION

(75) Inventors: Akiyoshi Fujii, Osaka (JP); Tokio Taguchi, Osaka (JP); Chiaki Minari, Osaka (JP); Takashi Yoshizawa, Osaka (JP); Katsuhisa Senda, Osaka (JP); Kenta Ishino, Osaka (JP); Eishi Katakami, Chiba (JP); Tsubasa Shiine, Chiba (JP)

(73) Assignees: Sharp Kabushiki Kaisha, Osaka (JP); Kyoritsu Chemical & Co., Ltd., Tokyo (JP)

( * ) Notice: Subject to any disclaimer, the term of this patent is extended or adjusted under 35 U.S.C. 154(b) by 0 days.

(21) Appl. No.: 13/979,766

(22) PCT Filed: Jan. 18, 2012

(86) PCT No.: PCT/JP2012/050971
§ 371 (c)(1),
(2), (4) Date: Jul. 16, 2013

(87) PCT Pub. No.: WO2012/099171
PCT Pub. Date: Jul. 26, 2012

(65) Prior Publication Data
US 2013/0302539 A1 Nov. 14, 2013

(30) Foreign Application Priority Data
Jan. 18, 2011 (JP) .................................. 2011-008175

(51) Int. Cl.
*C09K 19/00* (2006.01)
*H05K 5/06* (2006.01)
(Continued)

(52) U.S. Cl.
CPC . *H05K 5/062* (2013.01); *C09J 5/00* (2013.01); *C09J 11/06* (2013.01); *G09F 9/00* (2013.01)
USPC ........... 428/1.1; 428/1.5; 428/1.52; 428/1.54; 428/1.55; 428/353; 428/355 AC; 428/355 R; 428/463

(58) Field of Classification Search
CPC ... H05K 5/062; G02F 1/1333; G02F 1/13335; G02F 1/133308; G02F 2201/50; G02F 2202/28; G02F 2202/025; C09J 7/0217
USPC .............. 428/1.1, 1.51, 1.52, 1.54, 1.55, 463, 428/355 R, 353, 353 AC
See application file for complete search history.

(56) References Cited

U.S. PATENT DOCUMENTS

2002/0180712 A1 12/2002 Sato et al.
2005/0156907 A1 7/2005 Sato et al.
(Continued)

FOREIGN PATENT DOCUMENTS

JP 7-37274 A 2/1995
JP 8-94968 A 4/1996
(Continued)

OTHER PUBLICATIONS

Official Communication issued in International Patent Application No. PCT/JP2012/050971, mailed on Mar. 19, 2012.

*Primary Examiner* — Gwendolyn Blackwell
*Assistant Examiner* — Ruiyun Zhang
(74) *Attorney, Agent, or Firm* — Keating & Bennett, LLP

(57) ABSTRACT

The present invention provides a display panel with a flat plate in which a member partially provided with a light blocking part is disposed in front of a display panel, and a curable resin therebetween is sufficiently cured even in an area behind the light blocking part. The display panel with a flat plate of the present invention includes: a flat plate provided with a light passing part and a light blocking part; a display panel; and an adhesive layer between the flat plate and the display panel, the adhesive layer being a cured resin layer obtainable by polymerization involving at least one reactive component selected from the group consisting of a (meth)acrylate oligomer, a bicyclic ring-containing (meth)acrylate monomer, and a hydroxyl group-containing (meth)acrylate monomer, a peroxide component, and a primer as reaction materials.

12 Claims, 11 Drawing Sheets

(51) Int. Cl.
*C09J 5/00* (2006.01)
*C09J 11/06* (2006.01)
*G09F 9/00* (2006.01)

(56) References Cited

U.S. PATENT DOCUMENTS

| | | |
|---|---|---|
| 2005/0156908 A1 | 7/2005 | Sato et al. |
| 2006/0062938 A1* | 3/2006 | Takeko et al. ............... 428/1.55 |
| 2009/0186552 A1* | 7/2009 | Shinya et al. ................. 445/58 |
| 2009/0296033 A1 | 12/2009 | Shinya et al. |
| 2010/0003425 A1 | 1/2010 | Kamata et al. |
| 2010/0033661 A1 | 2/2010 | Shinya et al. |
| 2010/0043965 A1 | 2/2010 | Kamiya et al. |
| 2010/0097552 A1 | 4/2010 | Shinya et al. |
| 2010/0097746 A1 | 4/2010 | Toyoda et al. |
| 2010/0098839 A1 | 4/2010 | Toyoda et al. |
| 2010/0118245 A1 | 5/2010 | Toyoda et al. |
| 2010/0134713 A1 | 6/2010 | Toyoda et al. |
| 2010/0178834 A1 | 7/2010 | Toyoda et al. |
| 2010/0210166 A1 | 8/2010 | Toyoda et al. |
| 2012/0118483 A1 | 5/2012 | Toyoda et al. |

FOREIGN PATENT DOCUMENTS

| | | |
|---|---|---|
| JP | 2005-055641 A | 3/2005 |
| JP | 2005-250467 A | 9/2005 |
| JP | 2007-094191 A | 4/2007 |
| JP | 2008-129159 A | 6/2008 |
| JP | 2008-241728 A | 10/2008 |
| JP | 2008-281997 A | 11/2008 |
| JP | 2008-282000 A | 11/2008 |
| JP | 2008-308531 A | 12/2008 |
| JP | 2009-086656 A | 4/2009 |
| JP | 2009-186954 A | 8/2009 |
| JP | 2009-186955 A | 8/2009 |
| JP | 2009-275160 A | 11/2009 |
| JP | 2010-026539 A | 2/2010 |
| JP | 2010-215906 A | 9/2010 |

* cited by examiner

DISPLAY PANEL WITH FLAT PLATE, METHOD FOR MANUFACTURING DISPLAY PANEL WITH FLAT PLATE, AND RESIN COMPOSITION

TECHNICAL FIELD

The present invention relates to a display panel with a flat plate, a method for producing a display panel with a flat plate, and a resin composition. Specifically, the present invention relates to a display panel with a flat plate that is provided for display surface protection, crack resistance especially in the case of a large display surface, or aesthetic or other purposes, a method for producing such a display panel with a flat plate, and a resin composition with which the production method is practicable.

BACKGROUND ART

Display panels such as liquid crystal display panels are now used in a wide application range from business to household applications. So far, display panels of various sizes, specifically from a small size for mobile phones, game machines, or the like to a large size for televisions, outdoor information displays, or the like, have been fabricated, and practically used.

In recent years, display panels having an additional function, for example, capable of displaying three-dimensional (3D) images as well as conventional two-dimensional (2D) images, or providing images that change with the viewing angle, have been attracting attention. In some of these devices, a member for providing such an additional function is disposed in front of a conventional display panel.

In particular, some liquid crystal display panels for certain usages, which include thin glass substrates for a thinner design, are provided with a glass plate or a transparent plastic plate in front thereof for the purposes of, for example, display panel surface protection and crack resistance especially in the case of a large display panel. Another purpose of such a glass plate disposed in front of a display panel is to build a model that meets the need for a display design with a hard, glaring, and flat surface.

In a conventional model, such a plate (referred to as "flat plate"), specifically, a glass plate, a plastic plate, a 3D panel, or the like is disposed in front of a liquid crystal display panel with a certain space from the liquid crystal display panel surface to which a polarizer is provided. Such a space, however, is a cause of surface reflection at the refractive index interface between the liquid crystal display panel side (inner) surface of the flat plate and air or at the refractive index interface between the polarizer and air. This also causes problems such as double exposure images or reflection of an image that interferes with displayed images. These problems are attributed to the difference in refractive index between substances, and therefore can be solved by forming an anti-reflection coat on the surfaces at which reflection occurs, or replacing the air layer with a material having a refractive index close to that of the flat plate or the polarizer. These techniques can be seen in the case that a resin is filled in a space between a liquid crystal display panel and a flat plate (see Patent Literature 1) or in the case that a plasma panel and a flat plate is adhered by a resin disposed therebetween (see Patent Literature 2).

As other examples of improved display panels with a flat plate, there may be mentioned a display panel in which a flat plate is adhered using a resin having an elastic modulus after cure of not lower than a certain value to avoid stress that is generated when the resin is cured and shrinks, and may form streaks on the display (see Patent Literature 3), and in the case that a flat plate and a liquid crystal display panel are adhered together with a photocurable resin that is enclosed in a dam-like structure surrounded by a guide between the flat plate and the liquid crystal display panel (see Patent Literature 4).

When a flat plate is attached to a display panel by charging a photocurable resin composition in a space between the flat plate and the display panel, and photocuring the resin, there is the following disadvantage. For example, in the case where there is a part that blocks light, the light blocking part prevents a sufficient amount of light from reaching the entire resin, and therefore leaves a part of the resin uncured. One strategy to overcome this disadvantage is that the photocurable resin is cured by light irradiation from the outside to a lateral face to certainly allow even an area of the photocurable resin composition behind the light blocking part to be cured (see Patent Literatures 5 and 6). Another strategy to cure the area of the photocurable resin composition behind the light blocking part is to use a thermal polymerization initiator to allow the resin to be cured not only by photopolymerization but also by thermal polymerization (see Patent Literature 7). Use of both photopolymerization and thermal polymerization regardless the presence or absence of light blocking parts is also under development (see Patent Literature 8).

CITATION LIST

Patent Literature

Patent Literature 1: JP-A 2005-55641
Patent Literature 2: JP-A 2007-94191
Patent Literature 3: JP-A 2008-282000
Patent Literature 4: JP-A 2008-129159
Patent Literature 5: JP-A 2009-186954
Patent Literature 6: JP-A 2009-186955
Patent Literature 7: JP-A 2008-281997
Patent Literature 8: JP-A 2010-26539

SUMMARY OF INVENTION

Technical Problem

Alternatively, in order to adhere a flat plate to a display panel using a photocurable resin, the photocurable resin may be cured by light irradiation from two directions, namely, from the flat plate side and the display panel side. However, light irradiation from the liquid crystal display panel side is not preferable because light is blocked by members of the liquid crystal display panel such as TFTs, lines, and black matrix, and attenuated by color filters. Additionally, some display panels themselves block light. Accordingly, light should be emitted from the flat plate side, but may be interrupted by a light blocking part of the flat plate. Then, the strategy disclosed in Patent Literatures 5 and 6 seems to be possible, which involves adhering a flat plate and a display panel, and curing an uncured resin area behind a light blocking part by light irradiation from a lateral side. In general, such an area is thin, and unfortunately, a sufficient amount of light may not reach the entire area. Even if light reaches the entire area, a long period of irradiation is required to completely cure the area. Accordingly, this production process is not suitable. In particular, in the case of a large-scale display, it is difficult to sufficiently cure an entire area behind a light blocking part by this strategy.

An alternative strategy is to thermally cure an entire area behind a light blocking part. Unfortunately, thermal curing polymerization generates a shrinkage stress, and further generates a stress due to the difference in thermal expansion coefficient as the temperature decreases from a high temperature after the reaction. As a result, a thin glass plate may bend. In particular, when the thermal curing process is performed on a large display panel, this problem appears more seriously, and it is very difficult to suppress these stresses. Another problem is a property of thermally cured resins, namely, these resins are likely to lose transparency compared to photocurable resins. Additionally, there are disadvantages of production steps: thermally-curable resins cannot be processed at ordinary temperature; and the curing rate of thermally-curable resins is slower than that of photocurable resins.

The following illustrates problems of a liquid crystal display panel in which an uncured area remains. FIGS. 18 and 19 are cross-sectional views schematically illustrating a flat plate including a light blocking part and a display panel (to be) subjected to light irradiation from the flat plate side. FIG. 18 is a view before the light irradiation, and FIG. 19 is a view after the light irradiation. A general liquid crystal display panel 120 includes a pair of substrates 121 and 122 (for example, an active matrix substrate and a color filter substrate) each mainly composed of a glass substrate, and a liquid crystal layer 123 between the substrates 121 and 122. The substrates 121 and 122 are each provided with a polarizer 125 on the outer surface. When a flat plate 110 mainly composed of a transparent substrate 111 is attached to the liquid crystal display panel 120, a photocurable resin 131 is charged between the flat plate 110 and the polarizer 125 on the liquid crystal display panel 120, and cured by light irradiation from the flat plate 110 side. Thus, the flat plate 110 and the liquid crystal display panel 120 are adhered together. The flat plate 110 is partially provided with a light blocking layer 112 on the liquid crystal display panel 120 side surface. The light blocking layer 112 covers the periphery of the liquid crystal display panel 120, and has important functions of, for example, hiding the peripheral region on which no image is displayed, and improving the appearance.

When the liquid crystal display panel 120 is irradiated with light from the transparent substrate 111 side, the light blocking part 112 unfortunately prevents an area from being exposed to light, and therefore leaves an uncured area 116. In the flat plate 110, the area covered with the light blocking layer 112 is referred to as "light blocking part 101b", and the other area that is not covered with the light blocking layer 112 is referred to as "light passing area 101a". As shown in FIG. 18, the applied resin, which is liquid, is able to conform to the surfaces and does not cause the substrate to bend. Once the resin is cured, the resin shrinks to pull the liquid crystal display panel 120 towards the center, as shown in FIG. 19. In the case where the uncured area 116 is present, the liquid crystal display panel 120 is pulled very strongly, and bends up towards the resin. This phenomenon is more apparent when the glass (the transparent substrate of the flat plate) 111 on the surface is thick. Such bending of the glass substrates leads to a dimensional difference between the panel and the flat plate. The circumference along the edge of the liquid crystal display panel 120 is sealed with a seal 124, and the two glass substrates of the liquid crystal display panel 120 are fixed to each other with the seal 124. To compensate for the dimensional difference, the end part of the glass substrate on the flat plate 110 side deforms to be uneven. Consequently, the thickness of the liquid crystal layer 123 becomes uneven, which causes display streaks (also referred to as "circumferential streaks") along the periphery of the display region. Even when no circumferential streak is observed after cure, display streaks may appear after leaving the panel standing at a high temperature. This is presumably because exposure to different temperatures, for example, by performing an aging process causes a change in the stress distribution. FIG. 20 is a photograph of a liquid crystal display panel with luminous streaks that are attributed to uncured resin. In FIG. 20, there are black-and-white streaks within the area 5 to 10 mm from the edge along the edge of the display region of the liquid crystal display panel. Another problem of such an uncured area is that the resin may leak out, and monomer components of the resin may penetrate into a member (e.g. the polarizer) at the surface of the display panel, swell the polarizer, and deteriorate the performance thereof. This problem may lead to light leakage in black display and poor display quality.

The present invention was made to overcome the above problems, and an object of the present invention is to provide a display panel with a flat plate in which a member partially provided with a light blocking part is disposed in front of a display panel, and a curable resin therebetween is sufficiently cured even in an area behind the light blocking part.

Solution to Problem

The present inventors studied various ways to prevent an area behind a light blocking part from remaining uncured, and focused on a curing method other than photocuring and thermal curing. Specifically, a primer containing a metal complex is applied to the undersurface of the light blocking part, and a composition containing a reactive component such as a polymerizable monomer or oligomer component and a peroxide is prepared as an adhesive resin. Subsequently, the primer is contacted with the uncured resin composition, and dispersed into the resin composition to cause a radical generating reaction with the peroxide. This initiates polymerization of the reactive component. This mechanism enables the area of the uncured resin composition behind the light blocking layer to be cured without the need of light irradiation. This method allows for use of general photopolymerization curing to the light passing part, which is not covered with the light blocking layer, and therefore enables the flat plate and the display panel to be efficiently adhered together in a short time at ordinary temperature. It should be noted that the above-mentioned problems occur not only when the flat plate and the display panel are directly adhered together but also when another member is disposed between the flat plate and the display panel.

One possible example of the member between the flat plate and the display panel is a touch panel. There are several types of touch panels such as resistive touch panels, capacitive touch panels, and optical touch panels. The following description is based on representative examples of resistive touch panels and capacitive touch panels. In the case of an optical touch panel being used, the touch panel should be provided with infrared emitting/receiving elements or a surface acoustic wave oscillator, and a sensor. These members are located at the circumference of a liquid crystal display panel, and no other members are disposed as intermediate members between the flat plate and the display panel.

A resistive touch panel includes a plurality of base members (glass members or films made of PET or the like) provided with striped electrodes made of a transparent conductive film, and the members are stacked at intervals such that the direction of the electrode of each member is perpendicular to that of the electrode of the adjacent member (the X- or Y-axis direction). The touch panel detects the position of a finger based on a change in resistance caused by touch by the finger in use.

A capacitive touch panel includes substrates (made of glass, plastic, or the like) on which one or more base members (e.g. films) with electrodes formed by patterning of a transparent conductive film are attached (in the case that more than two base members are attached thereon, the extending directions of the electrodes should be perpendicular to each other). An AC electric field is already applied to the electrodes, and the panel detects the position of a finger by measuring a microcurrent that occurs due to a change in capacitance caused by touch by the finger in use.

A common feature of these types is one or more base members with electrodes. This feature may cause a later-described problem when the base member(s) are attached or set as intermediate member(s) in the front of the liquid crystal display panel.

Generally, such base members for resistive touch panels are arranged at about 0.1-mm intervals. When the base members are adhered onto a flat plate, or disposed between the flat plate and a liquid crystal display panel, a light blocking layer (including a line) of the flat plate blocks light, and leaves a cured area and an uncured area in a resin adhering the base members. Due to a stress generated at the boundary between these areas, the base members may deform, and the thickness of the spaces between the base members may become uneven. This may affect the sensitivity of the touch panel, or cause electrodes to contact with each other, and to lose their function. Such deformation may make the thickness of the resin uneven in an area near the boundary of the cured area and the uncured area, which can be a cause of distorted images. This problem is likely to occur when at least one of the base members is a soft member. In particular, in the case that a film member, which is softer than glass members, is attached to the liquid crystal display panel side as well as the flat plate side using a resin, the probability of the problem is much higher.

In a general capacitive touch panel, such base members are arranged without space therebetween, but include a soft member made of PET or the like, which is provided with electrical lines thereon. When a light blocking layer blocks light, and leaves a cured area and an uncured area in a resin, the resin deforms, and the thickness of the resin becomes uneven, which can be a cause of distorted images.

The presence of a light blocking part is attributed to the light blocking layer of the flat plate, an FPC on the touch panel, and a metal line along the circumference of the touch panel (if present).

The following description relates to problems attributed to uncured resin. For example, FIG. 21 is a cross-sectional view schematically illustrating a touch panel disposed between a flat plate and a liquid crystal display panel in which an uncured resin area is present. FIGS. 22 and 23 are plan views schematically illustrating a touch panel between a flat plate and a liquid crystal display panel. FIG. 22 shows the front surface, and FIG. 23 shows a surface exposed by removing the light blocking layer.

As shown in FIGS. 21 to 23, the touch panel 140 is mainly composed of a transparent substrate 141 made of glass or the like, and provided with a peripheral line 142 and a flexible print (FPC) substrate 143 in a peripheral area. In the case that an uncured resin 116 is present as shown in FIG. 21, the uncured resin 116 flows into the space between the liquid crystal display panel 120 and the back light unit 151, or into the back light unit 151, and thus can be a cause of poor display performance.

Some components of the leaking resin may erode acrylic films, cyclohexane films, and the like, which are used as TAC films of polarizers, retardation films, optical films, and the like.

Even if leaking uncured resin is wiped off, there still remain many practical restrictions. Specifically, most of widely used photocurable resins (in particular, UV curable resins) are acrylic resins, and a solvent may erode other optical films made of an acrylic resin, and penetrate into a TAC film, which is a base member of a polarizer, in the case that MEK (methyl ethyl ketone), MIBK (methyl isobutyl ketone), or the like is used as the solvent.

In contrast, the idea of the present inventors makes it possible to form an adhesive layer adhering a display panel to another member without leaving an uncured resin area, and therefore reduces the possibility of the above problem caused by leaking uncured resin. Thus, the present inventors arrived at the idea for overcoming the above problems, and completed the present invention.

Specifically, one aspect of the present invention is a display panel with a flat plate which includes: a flat plate provided with a light passing part and a light blocking part; a display panel; and an adhesive layer between the flat plate and the display panel, the adhesive layer being a cured resin layer formed by polymerization involving at least one reactive component selected from the group consisting of a (meth)acrylate oligomer, a bicyclic ring-containing (meth)acrylate monomer, and a hydroxyl group-containing (meth)acrylate monomer, a peroxide component, and a primer as reaction materials. The following description is offered to illustrate a display panel with a flat plate of the present invention in more detail.

The display panel with a flat plate of the present invention includes a flat plate provided with a light passing part and a light blocking part, and a display panel. The position of the light blocking part can be changed according to the intended use of the display panel, and thus is not limited at all. The flat plate is provided with both a light passing part and a light blocking part, and allows a viewer to see the display panel through the light passing part. The light blocking part may be, for example, a printed black film formed along the periphery of the display region to hide the peripheral region, or a printed black film in a stripe pattern for producing images that can be seen as three-dimensional images with naked eyes or images that change with the viewing position. Specifically, one preferable example of the flat plate is a panel that allows for display of a plurality of images on the display panel at once. This allows for display of, for example, three-dimensional (3D) images or images that change with the viewing angle.

The display panel with a flat plate of the present invention includes an adhesive layer between the flat plate and the display panel, and the adhesive layer is a cured resin layer formed by polymerization involving at least one reactive component selected from the group consisting of a (meth)acrylate oligomer, a bicyclic ring-containing (meth)acrylate monomer, and a hydroxyl group-containing (meth)acrylate monomer, a peroxide component, and a primer as reaction components. Preferably, the reactive component includes all of the (meth)acrylate oligomer, the bicyclic ring-containing (meth)acrylate monomer, and the hydroxyl group-containing (meth)acrylate monomer. Additionally, in the present invention, at least an area of the adhesive layer behind the light blocking part of is formed of a polymer produced by polymerization of the reactive component which is initiated by radicals produced in the reaction of the peroxide and the primer. The area other than the area behind the light blocking part may also be cured by the same mechanism.

The term "(meth)acrylate oligomer" refers to oligomers having at least one (meth)acrylate group at a terminal or in a side chain, and examples thereof include polyisopropylene (meth)acrylate, polybutadiene(meth)acrylate, urethane (meth)acrylate, epoxy(meth)acrylate, polyester(meth)acrylate, and melamine(meth)acrylate. Specific examples of commercial products thereof include UC-1 (product of KURARAY CO., LTD., polyisoprene(meth)acrylate) and TE-2000 (product of Nippon Oil Corporation, polybutadiene (meth)acrylate).

Examples of the bicyclic ring-containing (meth)acrylate monomer include dicyclopentenyloxyethyl(meth)acrylate, norbornene(meth)acrylate, isobornyl(meth)acrylate, and dimethylol-tricyclodecane di(meth)acrylate. Specific examples of commercial products thereof include QM-657 (product of Rohm & Haas Company, dicyclopentenyloxy ethylacrylate) and LIGHT ESTER IB-XA (product of KYOEISHA Chemical Co., Ltd., isobornyl acrylate).

Examples of the hydroxyl group-containing (meth)acrylate monomer include 2-hydroxyethyl(meth)acrylate, 2-hydroxypropyl(meth)acrylate, 2-hydroxybutyl(meth)acrylate, and 4-hydroxybutyl(meth)acrylate. Specific examples of commercial products thereof include LIGHT ESTER HOB-A (product of KYOEISHA Chemical Co., Ltd., 2-hydroxybutyl(meth)acrylate).

More specifically, the term "(meth)acrylate" herein refers to methyl(meth)acrylate, ethyl(meth)acrylate, n-propyl (meth)acrylate, n-butyl(meth)acrylate, t-butyl(meth)acrylate, isobutyl(meth)acrylate, ethylhexyl(meth)acrylate, isodecyl(meth)acrylate, n-hexyl(meth)acrylate, stearyl(meth) acrylate, lauryl(meth)acrylate, tridecyl(meth)acrylate, ethoxyethyl(meth)acrylate, methoxyethyl(meth)acrylate, glycidyl(meth)acrylate, butoxyethyl(meth)acrylate, 2-methoxyethyl(meth)acrylate, methoxy diethyleneglycol(meth) acrylate, ethoxy diethyleneglycol(meth)acrylate, methoxy dipropyleneglycol(meth)acrylate, allyl(meth)acrylate, (meth)acryloylmorpholine, 1,2,2,6,6-pentamethylpiperidinyl(meth)acrylate, benzyl(meth)acrylate, and tetrahydrofurfuryl(meth)acrylate.

The primer herein is not limited at all, provided that it produces radicals with the peroxide. Preferably, the primer includes a metal complex containing at least one element selected from the group consisting of iron (Fe), aluminum (Al), cobalt (Co), manganese (Mn), tin (Sn), zinc (Zn), vanadium (V), chromium (Cr), zirconium (Zr), indium (In), and titanium (Ti).

The peroxide herein is not limited at all, provided that it produces radicals with the primer, and examples thereof include ketone peroxides, peroxyketals, hydroperoxides, dialkyl peroxides, diacyl peroxides, peroxyesters, and peroxy dicarbonate. Specific examples of commercial products thereof include PEROYL L and NYPER BMT (products of NOF CORPORATION, diacyl peroxides), PERBUTYL Z, PERBUTYL PV, and PERBUTYL O (products of NOF CORPORATION, peroxyesters) and PERCUMYL H and PEROCTA H (products of NOF CORPORATION, hydroperoxides).

The present invention enables at least an area behind a light blocking part to be cured into a cured resin layer without performing photocuring and thermal curing, ensures sufficient curing, and can avoid the problems caused by conventional methods such as light irradiation from a lateral side or heating.

In the case that an intermediate member is disposed between the flat plate and the display panel, the adhesive layer of the display panel with a flat plate of the present invention may be a layer adhering the intermediate member with the flat plate or the display panel. Specifically, the following structures can be mentioned as examples of the structure of the display panel with a flat plate of the present invention: (i) the adhesive layer is a cured resin layer adhering the flat plate and the display panel; and (ii) an intermediate member is disposed between the flat plate and the display panel, and the adhesive layer is a cured resin layer adhering the display panel and the intermediate layer. The number of the intermediate members is not limited at all.

The structure of the display panel with a flat plate of the present invention is not particularly limited by other members as long as it includes these essential members.

The following description is offered to illustrate preferable embodiments of the display panel with a flat plate of the present invention in detail.

An area of the cured resin layer behind the light passing part of the flat plate is preferably formed by polymerization involving the reactive component and a photopolymerization initiator as reaction materials. Such photopolymerization using a photopolymerization initiator provides a cured resin layer having a high transmissivity, and therefore ensures good visibility of the display panel. Additionally, the photopolymerization using a photopolymerization initiator can proceed at ordinary temperature unlike thermal polymerization, and establishes adhesion more rapidly (in several minutes to several hours) than use of an adhesive, and thus is advantageous in terms of cycle time. An essential feature of the present invention lies in that the area behind the light blocking area is formed by polymerization involving the reactive component, the peroxide component, and the primer, and this embodiment ensures better reactivity and visibility of the light passing part.

Alternatively, the cured resin layer is preferably formed substantially only by polymerization involving the reactive component, the peroxide component, and the primer as reaction materials. This embodiment can be usable, for example, in the case that no limit is imposed on the production time, or in the case that photopolymerization is not suitable because the area of the light blocking part is much larger than the area of the light passing part.

The cured resin layer preferably has a storage modulus at 25° C. of not less than 1.1 kPa. If the storage modulus after cure of the cured resin layer is lower than 1.1 kPa, the resin is flowable, and may fail to sufficiently fix the members, and cause display streaks. In order to ensure reliability, this condition is preferably met.

The display panel is preferably a liquid crystal display panel including substrates and a liquid crystal layer between the substrates. In particular, in the case of a liquid crystal display panel, an uncured area, if present, behind the light blocking part can cause display streaks, as described above. To avoid this, the present invention is suitable for liquid crystal display panels.

The flat plate is preferably a panel that allows for display of a plurality of images on the display panel at once. Examples of such panels include a panel that allows for display of three-dimensional images and a panel that allows for display of images that change with the viewing position.

In order to produce three-dimensional images, for example, a panel including a light blocking part having slits may be disposed in front of or behind the display screen. The light blocking part includes lines arranged in a stripe pattern, allows for display of different images for the respective eyes on the display panel at once, and therefore can display three-dimensional images. Accordingly, the present invention is particularly suitable for three-dimensional display panels. Specifically, the flat plate is preferably a three-dimensional display panel that includes a light blocking part having slits, and is to be disposed in front of or behind the display screen.

Alternatively, a light blocking member having slits may be disposed in front of the display panel to form a light blocking part having a stripe pattern similarly to that of the above-mentioned three-dimensional display panel. This panel allows for display of images that change with the viewing position. This type of light blocking member, which blocks light and prevents an area from being exposed to light, is suitably used with the present invention. Thus, the flat plate is preferably a panel capable of producing images that change with the viewing position.

In particular, in the case that the intermediate member includes a light blocking member that is disposed to be behind the light blocking part of the flat plate, the present invention is suitably used. In this case, the light blocking member may block light and leave an uncured area even when light is emitted from the side opposite to the light blocking part of the flat plate. The method using the reactive component, however, enables an area which light does not reach to be cured, and thus prevents a problem of leakage of uncured resin to other areas. Examples of such as intermediate members include touch panels. A general touch panel includes peripheral lines that block light and an FPC substrate outside a display region (the region overlapping the light passing part of the flat plate).

The present invention further relates to a method for producing such a display panel with a flat plate. Specifically, another aspect of the present invention is a method for producing a display panel with a flat plate including a flat plate provided with a light passing part and a light blocking part, a display panel, and an adhesive layer between the flat plate and the display panel, the method including the steps of: charging a primer between the light blocking part of the flat plate and the display panel; charging an uncured resin composition containing at least one reactive component selected from the group consisting of a (meth)acrylate oligomer, a bicyclic ring-containing (meth)acrylate monomer, and a hydroxyl group-containing (meth)acrylate monomer, and a peroxide component into a space between the flat plate and the display panel and applying the composition onto the primer; and curing the uncured resin composition on the primer, thereby providing a cured resin layer serving as an adhesive layer. Preferably, the reactive component includes all of the (meth)acrylate oligomer, the bicyclic ring-containing (meth)acrylate monomer, and the hydroxyl group-containing (meth)acrylate monomer.

The curing using the primer causes curing only in an area near the area to which the primer is applied, and this means that it is possible to determine any area as an area to be cured unlike thermal curing by which it is difficult to cure only a limited area. The present invention allows an area which light emitted from the flat plate side does not reach to be cured by the action of the primer, and therefore does not leave an uncured area. Accordingly, the area of the cured resin layer behind the light blocking part of the flat plate is preferably formed by polymerization involving radicals generated by the reaction of the primer and the peroxide component.

Additionally, the curing using the primer allows for curing at around room temperature, and therefore allows the resin composition to be cured without generating a stress therein unlike thermal curing involving heating to a high temperature. Thus, it is possible to prevent streaks attributed to stress.

The method for producing a display panel with a flat plate of the present invention is not particularly limited by other production steps as long as it includes these essential production steps. As specific examples of the reactive component, the peroxide component, and the primer used in the production method of the present invention, there may be mentioned the same examples listed for the display panel with a flat plate of the present invention.

In the method for producing a display panel with a flat plate of the present invention, the adhesive layer is not limited to a layer adhering the flat plate and the display panel. In the case that an intermediate member is disposed between the flat plate and the display panel, the adhesive layer may be a layer adhering the display panel and the intermediate member.

Specifically, the method for producing a display panel with a flat plate of the present invention may further include the step of: (i) attaching the flat plate and the display panel through the uncured resin composition; or (ii) disposing an intermediate member between the flat plate and the display panel, and attaching the display panel and the intermediate member through the uncured resin composition as the adhesive layer.

The following description is offered to illustrate a preferable embodiment of the method for producing a display panel with a flat plate of the present invention in detail.

The production method preferably further includes, after the above-mentioned step of curing the uncured resin on the primer, the step of emitting light in such a manner that the light passes through the light passing part of the flat plate, thereby forming a cured resin layer behind the light passing part of the flat plate. It is preferable that the light passing part of the display panel is subjected to light irradiation, which can uniformly treat a wider area in a shorter time, because the entire area of the display panel is much larger than that of the light passing part, which corresponds to the display region. This reduces the cycle time.

The curing using the primer, which proceeds more slowly than photocuring, may be allowed to gradually proceed after photocuring. This makes it possible to alleviate stress concentration caused by shrinkage around the boundary region of curing in which there are differences in the physical properties (in particular, shrinkage property) between the two resin areas caused by curing the resin because the uncured area is cured to conform to the shrinking shape of the already cured photocurable area.

It is preferable that the uncured resin composition contains a photopolymerization initiator, and an area of the cured resin layer behind the light passing part of the flat plate is formed by polymerization initiated by radicals produced by the photopolymerization initiator in response to light irradiation. This allows for rapid and sufficient photopolymerization.

The production method preferably further includes the step of precuring the area of the uncured resin composition behind the light blocking part of the flat plate by emitting light towards the space between the flat plate and the display panel. The precuring prevents the flat plate and the display panel from moving relative to each other in the curing using the primer, which proceeds slowly.

The preferable embodiments of the method for producing a display panel with a flat plate are described so far. The above-described preferable embodiments of the display panel with a flat plate can be applied to the production method to produce the same effects.

Still another aspect of the present invention is a resin composition intended to be applied to a base member including a light passing part and a light blocking part, and adhering the base member to another base member, the resin composition being a composition that contains at least one reactive component selected from the group consisting of a (meth)acrylate oligomer, a bicyclic ring-containing (meth)acrylate monomer, and a hydroxyl group-containing (meth)acrylate monomer, and a peroxide component, and is cured by a chemical reaction involving a primer.

Advantageous Effects of Invention

When a flat plate partially provided with a light blocking part is attached to a display panel, the present invention allows an area of a curable resin behind the light blocking part to be sufficiently cured.

DESCRIPTION OF EMBODIMENTS

The following embodiments are offered to illustrate the present invention in more detail with reference to the figures, but are not intended to limit the present invention.

The present invention covers display panels with a flat plate provided with a light blocking part, and the size of the display screen is not limited at all. The "flat plate" herein is not limited to a single plate (e.g. a glass plate or a plastic plate) like those described in the following embodiments. One example of the flat plate is a panel consisting of two or more plates for producing three-dimensional images.

The flat plate is disposed in front of (on the display surface side of) the display panel for the purpose of protection of the front face of the display panel, but the position of the flat plate is not limited only to in front of the display panel. For example, in the case that a flat plate is a three-dimensional panel with slits, and a display panel has transmissitity, the slits can function even when they are located at either in front of or behind the display panel.

In the present invention, other intermediate members such as a touch panel may be disposed between the flat plate and the display panel as long as the display panel includes an adhesive layer defined in the present invention.

Larger-scale displays often have more apparent circumferential display streaks. Therefore, the present invention is useful for large-scale (20 inch or larger) devices, and is suitably used, in particular, for large-scale displays such as televisions, electric sign boards, information displays (e.g. electric guide boards in stations and airports), and digital signage displays. On the other hand, smaller-scale display panels tend to have a high probability of poor display quality caused by leakage of uncured resin into a panel. To avoid this in small-scale (10 inch or smaller) devices, the present invention is also useful, and specifically, is suitably used for small-scale displays such as mobile phones and game machines.

Examples of display panels to which the present invention can be applied include liquid crystal display (LCD) panels, electroluminescence (EL) display panels, and plasma display panels.

Embodiment 1

Figure 1:
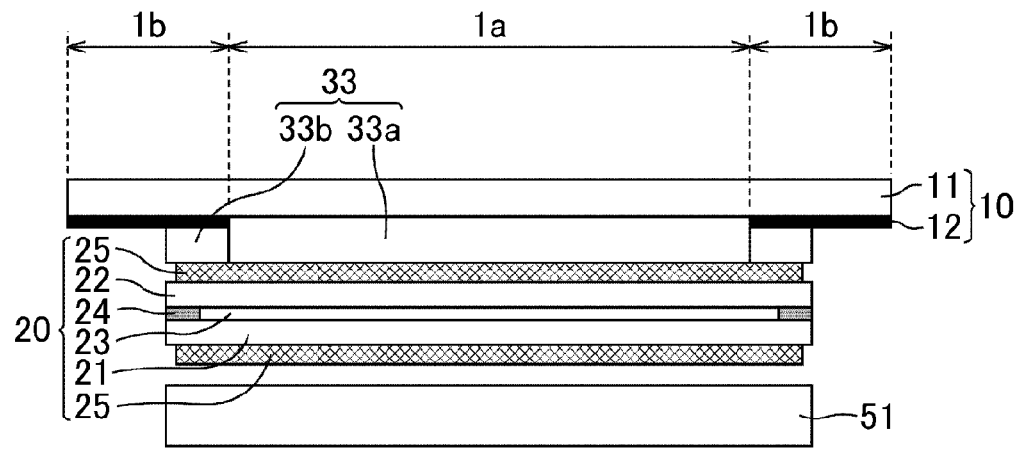
FIG. 1 is a cross-sectional view schematically illustrating a display panel with a flat plate of embodiment 1.
Figure 2:
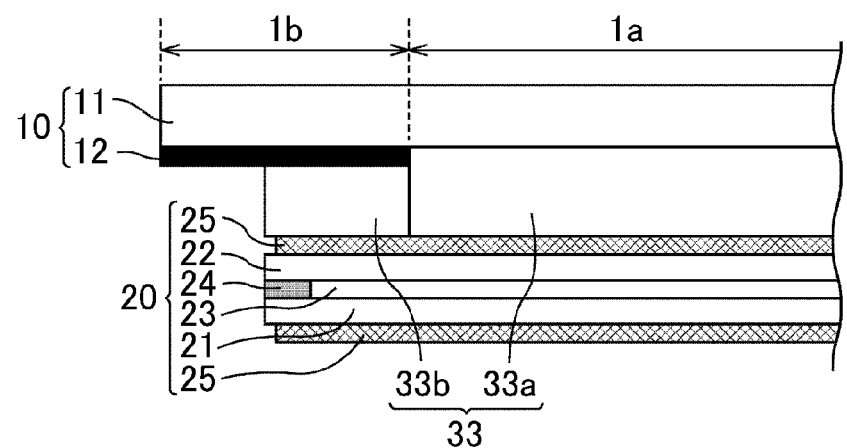
FIG. 2 is an enlarged view of a part where the flat plate and the display panel of embodiment 1 are attached.

Embodiment 1 provides a display panel with a flat plate in which a flat plate is disposed in front of a liquid crystal display panel. FIG. 1 is a cross-sectional view schematically illustrating the display panel with a flat plate of embodiment 1, and FIG. 2 is an enlarged view of a part where the flat plate and the display panel of embodiment 1 are attached. As shown in FIG. 1, the flat plate 10 is attached to the display panel 20 through a cured resin layer 33 in embodiment 1.

As shown in FIG. 2, the display panel 20 includes a pair of substrates 21 and 22, and a liquid crystal layer 23 between the substrates 21 and 22. One of the substrates 21 and 22 is an active matrix substrate 21, and the other is a color filter substrate 22. The active matrix substrate 21 is mainly composed of an insulative substrate such as a glass substrate, and includes members for regulating the alignment of liquid crystal molecules, such as TFTs, pixel electrodes, and various lines (e.g. scan lines and signal lines), on the insulative substrate. Likewise, the color filter substrate 22 is mainly composed of an insulative substrate such as a glass substrate, and includes members such as color filters, a black matrix, and a common electrode on the insulative substrate. A liquid crystal material is enclosed in the space between the substrates 21 and 22. This space is surrounded by a seal 24, and a spacer is disposed to secure a certain distance between the substrates. Each of the substrates 21 and 22 is provided with a polarizer 25 on the outer surface thereof, and these polarizers control light emitted to the display panel 20 and light proceeding in the display panel 20 to pass therethrough to the outside or to be blocked.

The flat plate 10 is mainly composed of a transparent substrate 11 made of glass, plastic, or the like, and protects the surface of the display panel 20. A black matter (light blocking layer) 12 for blocking light is partially printed on the display panel 20 side surface of the transparent substrate 11. The flat plate 10 includes a light passing part 1a and a light blocking part 1b. The light blocking part 1b refers to an area in which a light blocking layer 12 is formed, and the light passing part 1a refer to the other area. The light passing part 1a substantially corresponds to a display region, and allows a viewer to see images produced by the display panel 20. In embodiment 1, the light blocking layer 12 is located along the edge of the display region (light passing part) 1a of the display panel 20. The light blocking part 1b hides peripheral members, such as peripheral circuits, of the display panel 20, and therefore improves the appearance.

The cured resin layer 33 is a layer formed by polymerization of at least one reactive component selected from the group consisting of a (meth)acrylate oligomer, a bicyclic ring-containing (meth)acrylate monomer, and a hydroxyl group-containing (meth)acrylate monomer into a polymer. Preferably, the cured resin layer 33 is formed by using all of these components. One example of the ratio of these components before polymerization is 30 to 50 parts by mass of the (meth)acrylate oligomer, 30 to 50 parts by mass of the bicyclic ring-containing (meth)acrylate monomer, and 10 to 30 parts by mass of the hydroxyl group-containing (meth)acrylate monomer. A resin composition containing the reactive component is charged between the flat plate 10 and the display panel 20, and the predetermined reaction is caused. As a result, the cured resin layer 33 is formed by polymerization as an adhesive layer adhering the flat plate and the display panel. When the (meth)acrylate is used, the resulting polymer can be easily controlled to have high transmissivity and a refractive index equivalent to that of glass.

The cured resin layer 33a behind the light passing part 1a is formed by radical polymerization of the reactive component which is induced by radicals produced by the photopolymerization initiator in response to light irradiation from the flat plate 10 side. The cured resin layer 33b behind the light blocking part 1b is formed by radical polymerization in which radicals produced by the reaction of the primer and the peroxide initiate polymerization of the reactive component. The amount of the peroxide in the resin composition before radical generation is, for example, 0.5 to 5% by mass relative to 100% by mass of the whole resin composition. Thus, although the light blocking part 1b inhibits light irradiation, this method ensures sufficient polymerization without leaving an uncured area regardless of the presence of the light blocking part 1b of the flat plate 10. Additionally, the combination of radical polymerization by light irradiation and radical polymerization involving the primer and the peroxide does not cause rapid curing shrinkage, and therefore can avoid variations in size of the display panel with a flat plate, and ensure high reliability.

Especially, embodiment 1 ensures good display quality because even when the substrates of the liquid crystal display panel are large thin glass substrates, this embodiment prevents the glass substrates from bending and having a wavy edge, and in turn prevents the thickness of the liquid crystal layer 23 from becoming uneven, and also prevents display streaks in the periphery of the display panel. The area of the cured resin layer behind the light passing part 1a, which is made of a polymer obtained by photopolymerization, has high transmissivity.

The thickness of the flat plate 10 is preferably 0.5 to 3 mm. The thickness of the light blocking layer 12 is preferably 20 µm. The width of the light blocking layer 12 is preferably 5 to 30 mm although it depends on the panel size. If the width of the light blocking layer 12 is more than 1 mm, light emitted from a lateral side does not reach the entire area behind this layer. The thickness of the cured resin layer is preferably 50 to 150 µm. The thickness of the insulative substrates (e.g. glass substrates) of the substrates of the liquid crystal display panel is preferably 0.5 to 1.1 mm. These ranges are mentioned only as examples, and are not intended as limitations.

Figure 3:
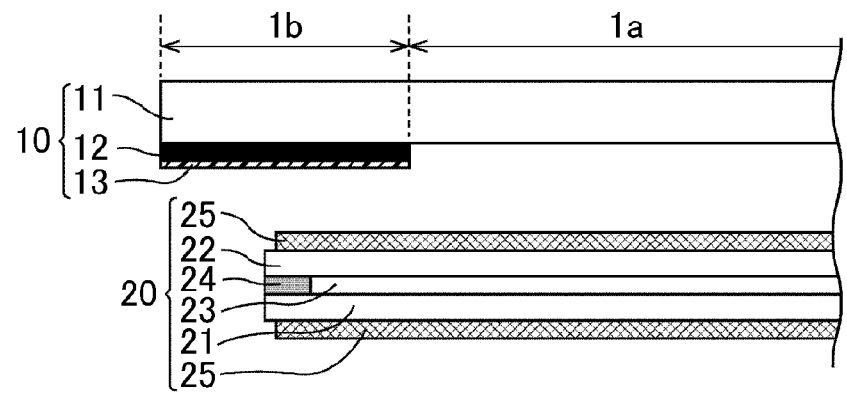
FIG. 3 is a cross-sectional view illustrating a step for attaching the flat plate and the display panel in embodiment 1.
Figure 4:
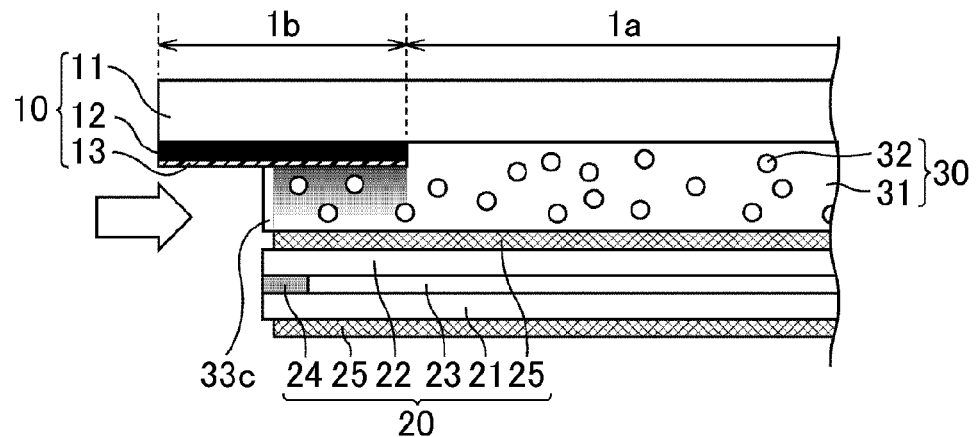
FIG. 4 is a cross-sectional view illustrating another step for attaching the flat plate and the display panel in embodiment 1.
Figure 5:
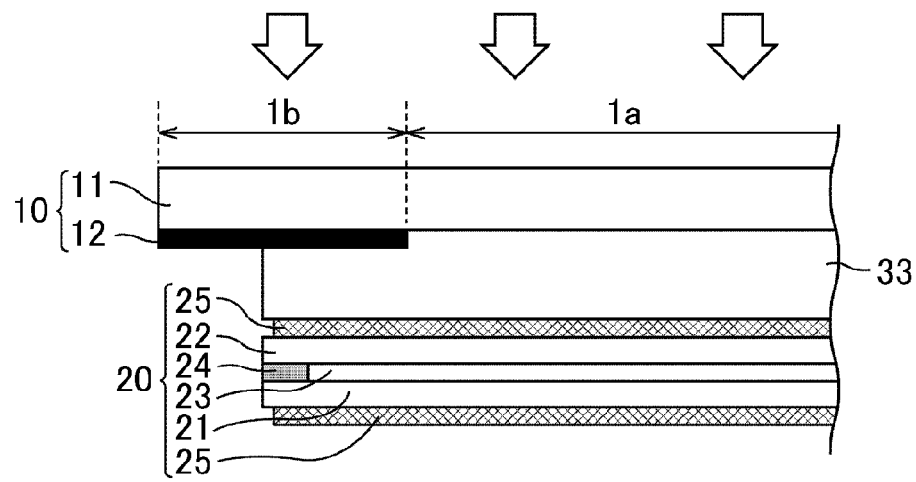
FIG. 5 is a cross-sectional view illustrating a still another step for attaching the flat plate and the display panel in embodiment 1.

The following description is offered to illustrate the procedure of attaching the flat plate and the display panel in embodiment 1 in more detail. FIGS. 3 to 5 are cross-sectional views each illustrating a step for attaching the flat plate and the display panel in embodiment 1.

First, as shown in FIG. 3, the display panel 20 and the flat plate 10, which is partially provided with the light blocking layer 12, are prepared. The primer 13 is already applied to the display panel 20 side surface of the light blocking layer 12. Examples of materials of the primer 13 include metal complexes containing iron (Fe), aluminum (Al), cobalt (Co), manganese (Mn), tin (Sn), zinc (Zn), vanadium (V), chromium (Cr), zirconium (Zr), indium (In), or titanium (Ti).

Next, as shown in FIG. 4, the display panel 20 and the flat plate 10 are aligned such that the end of the display panel 20 overlaps the light blocking layer 12 of the flat plate 10, the resin composition 30 containing the reactive component 31 and peroxide component 32 is charged between the display panel 20 and the flat plate 10, and then the flat plate 10 and the display panel 20 are attached. Once these are attached, the primer 13 begins to spread into the resin composition 30, and reacts with the peroxide 32 to produce radicals. Namely, when the flat plate 10 and the display panel 20 are attached, polymerization occurs in the light blocking part 12. Since the undersurface of the light passing part 1a of the flat plate 10 is not coated with the primer, only an area of the resin composition 30 behind the light blocking part 1b, that is, an area where the primer 13 spreads is cured.

At the same time as attaching the flat plate 10 and the display panel 20, light is emitted from a lateral side to the attaching part between the flat plate 10 and the display panel 20, as shown in FIG. 4. This light irradiation process is a precuring process to prevent the flat plate 10 and the display panel 20 from moving relative to each other, and aims to solidify around the edge surface. Therefore, short-time irradiation is enough, and this does not cure the entire area of the resin behind the light blocking layer 12.

Subsequently, the entire flat plate 10 is irradiated with light at once from the transparent substrate 11 side, as shown in FIG. 5. This is final curing. Light passing through the light passing part of the flat plate 10 reaches the resin composition 30 to initiate photopolymerization and curing. Since the light blocking part 12 of the flat plate 10 blocks light, the polymerization is not initiated by the light irradiation in the area of the resin composition 30 behind the light blocking part 12.

Thus, the cured resin layer 33 is completed without leaving an uncured area behind the light passing part 1a and the light blocking part 1b of the flat plate 10.

Figure 6:
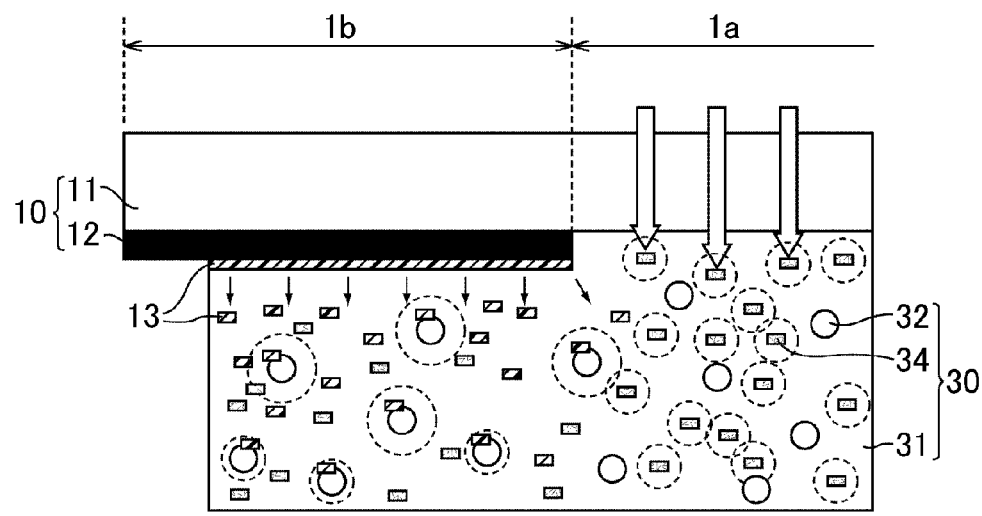
FIG. 6 is a cross-sectional view schematically illustrating polymerization involving a reactive component, a primer, and a peroxide as reaction materials.

The following description is given to illustrate the mechanism of the polymerization reactions in the above-described steps. FIG. 6 is a cross-sectional view schematically illustrating the polymerization reaction involving the reactive component, the primer, and the peroxide as reaction components.

As shown in FIG. 6, when the resin composition 30 is contacted with the area coated with the primer 13, the primer 13 begins to spread into the resin composition 30 (in the directions of the small arrows in the figure). The spreading primer 13 reacts with the peroxide 32 in the resin composition 30 to produce radicals. The radicals initiate polymerization of the reactive component 31 in the resin composition 30. Since the primer 13 is applied only to the undersurface of the light blocking part 1b, the curing reaction occurs only in an area behind the light blocking part 1b. However, the curing reaction does not occur in an area apart from the light blocking part 1b because the primer 13 does not reach this area.

On the other hand, the resin composition 13 contains the photopolymerization initiator 34, and the photopolymerization initiator 34 produces radicals in response to light irradiation so as to initiate polymerization of the reactive component 31 in an area around the radicals, as shown in FIG. 6. Thus, the light irradiation causes photopolymerization in the area behind the light passing part 1a, but does not cause polymerization in the area behind the light blocking part 1b because light does not reach this area.

According to the nature of this mechanism, the concentration of the photopolymerization initiator in the area of the cured resin layer behind the light passing part 1a of the cured resin layer is lower than the photopolymerization initiator concentration in the area of the cured resin layer behind the light blocking part 1b, and the concentration of the primer in the area of the cured resin layer behind the light passing part 1a is lower than the primer concentration in the area of the cured resin layer behind the light blocking part 1b.

Embodiment 2

Figure 7:
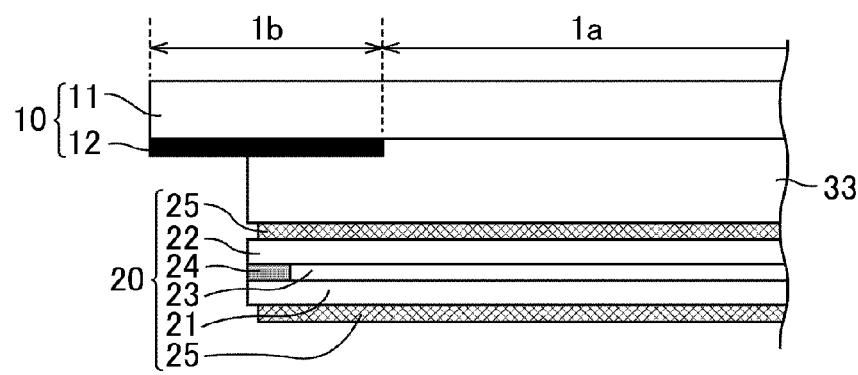
FIG. 7 is a cross-sectional view schematically illustrating a display panel with a flat plate of embodiment 2.

Embodiment 2 is a display panel with a flat plate in which a flat plate is disposed in front of a liquid crystal display panel. FIG. 7 is a cross-sectional view schematically illustrating the display panel with a flat plate of embodiment 2. As shown in FIG. 7, a flat plate 10 is attached to a display panel 20 through a cured resin layer 33.

The display panel with a flat plate of embodiment 2, which is produced by a different method from that of embodiment 1, differs from that of embodiment 1 in some points such as components remaining in the cured resin layer, but share the following same basic features: the cured resin layer 33 does not include an uncured area behind the light passing part 1a and the light blocking part 1b of the flat plate; and no complicated process such as heat treatment is required.

Figure 8:
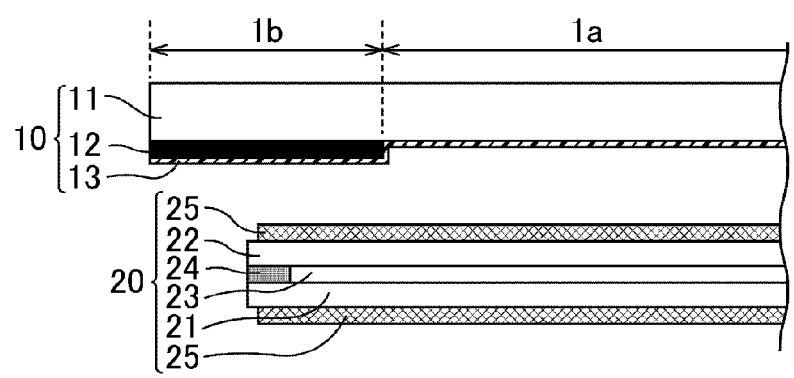
FIG. 8 is a cross-sectional view illustrating a step for attaching the flat plate and the display panel in embodiment 2.
Figure 9:
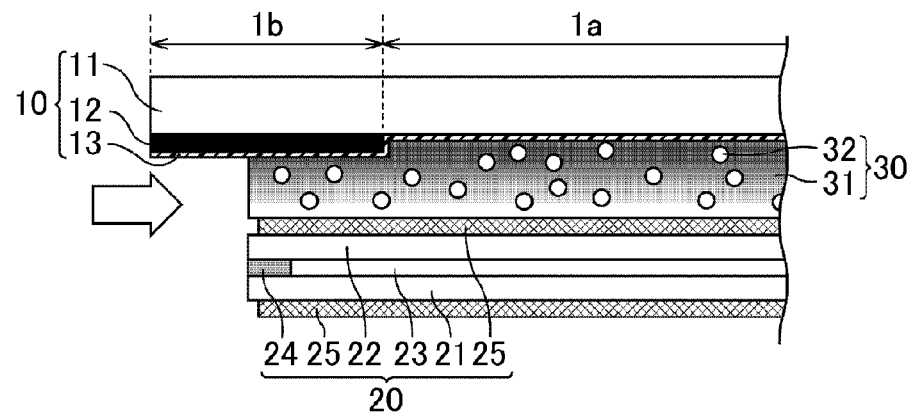
FIG. 9 is a cross-sectional view illustrating another step of attaching the flat plate and the display panel in embodiment 2.
Figure 10:
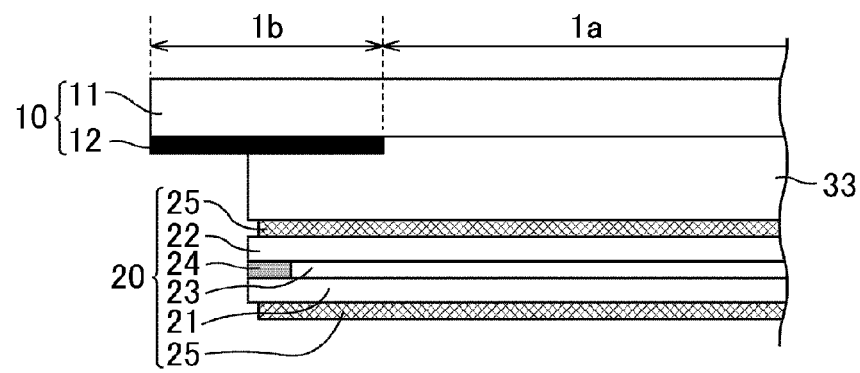
FIG. 10 is a cross-sectional view illustrating a still another step of attaching the flat plate and the display panel in embodiment 2.

The following description is offered to illustrate the procedure of attaching the flat plate and the display panel in embodiment 2 in more detail. FIGS. 8 to 10 are cross-sectional views each illustrating a step for attaching the flat plate and the display panel in embodiment 2.

First, as shown in FIG. 8, the display panel 20 and the flat plate 10, which is partially provided with the light blocking layer 12, are prepared. In embodiment 2, the primer 13 is already applied to the entire display panel side surface of the flat plate 10 including the area serving as a light passing part 1a as well as the area serving as a light blocking part 1b. The same materials as those described in embodiment 1 can be used as the primer 13.

Next, as shown in FIG. 9, the display panel 20 and the flat plate 10 are aligned such that the end of the display panel 20 overlaps the light blocking layer 12 of the flat plate 10, the resin composition 30 containing the reactive component 31 and peroxide component 32 is charged between the display panel 20 and the flat plate 10, and then the flat plate 10 and the display panel 20 are attached. Once these are attached, the primer 13 begins to spread into the resin composition 30, and reacts with the peroxide 32 to produce radicals. Namely, when the flat plate 10 and the display panel 20 are attached, polymerization occurs.

At the same time as attaching the flat plate 10 and the display panel 20, light is emitted from a lateral side to the attaching part between the flat plate 10 and the display panel 20, as shown in FIG. 9. This light irradiation process is a precuring process to prevent the flat plate 10 and the display panel 20 from moving relative to each other, and aims to solidify around the edge surface. Therefore, short-time irradiation is enough.

After a certain period of standing, the cured resin layer 33 is completed without leaving an uncured area behind the light passing part 1a and the light blocking part 1b of the flat plate 10, as shown in FIG. 10. Embodiment 2 does not need multiple step polymerization including photopolymerization, thermal polymerization, and the like although the reaction rate in embodiment 2 is slower than that in embodiment 1. Additionally, the above process can be performed at ambient temperature.

An appropriate combination of the features of embodiments 1 and 2 described so far is acceptable. Specifically, one possible example is that the area of the resin composition behind the light blocking part is likewise cured by polymerization using the primer, but a part of the area of the resin composition behind the light passing part is cured by photopolymerization, and the remaining part is cured by polymerization using the primer or the like.

Embodiment 3

Figure 11:
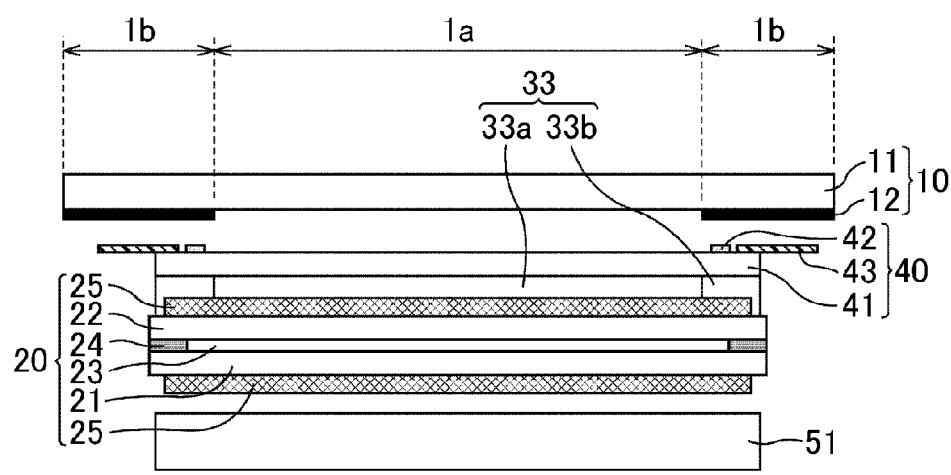
FIG. 11 is a cross-sectional view schematically illustrating a display panel with a flat plate of embodiment 3.

Embodiment 3 is a display panel with a flat plate of a touch panel type. FIG. 11 is a cross-sectional view schematically illustrating the display panel with a flat plate of embodiment 3. As shown in FIG. 11, a touch panel (intermediate member) 40 is disposed between the flat plate 10 and the liquid crystal display panel 20. The touch panel 40 is attached to the liquid crystal display panel 20 through a cured resin layer 33. The cured resin layer 33 can be formed in the same manner as in embodiment 1 or 2.

The layer shown in FIG. 11 is an example obtained by curing a resin composition in the same manner as in embodiment 1. Specifically, the cured resin layer 33a behind the light passing part 1a is formed by radical polymerization of the reactive component which is initiated by radicals produced by the photopolymerization initiator in response to light irradiation from the flat plate 10 side. The cured resin layer 33b behind the light blocking part 1b is formed by radical polymerization in which radicals produced by the reaction of the primer and the peroxide initiate polymerization of the reactive component.

The light blocking part of the flat plate prevents the entire area covered with the light blocking part from being exposed to light, and leaves uncured resin between the touch panel and the liquid crystal display panel, and thus may affect the adhesion therebetween unless the method of embodiment 3 is not used.

Embodiment 3 does not leave uncured resin, and therefore can avoid the problem of leakage of uncured resin into the space between the liquid crystal display panel 20 and the back light unit 51 or into the back light unit 51. Additionally, it is possible to avoid a problem of penetration of uncured resin into the periphery of the display region which may occur when the touch panel is pressed with a finger, and may cause display streaks in the periphery of the display region.

Embodiment 4

Figure 12:
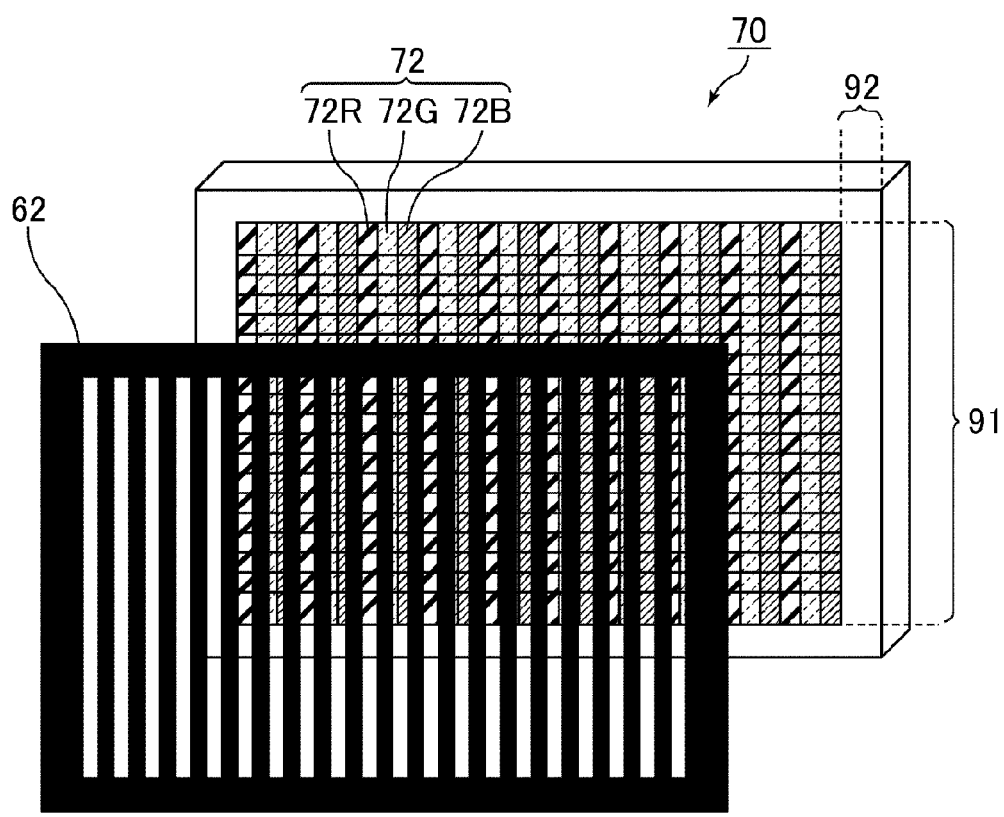
FIG. 12 is a perspective view schematically illustrating a display panel with a flat plate of embodiment 4.

Embodiment 4 is a display panel with a flat plate in which a flat plate is disposed in front of a display panel, and allows for display of a plurality of images on the display panel at once. FIG. 12 is a perspective view schematically illustrating the display panel with a flat plate of embodiment 4. As shown in FIG. 12, a black printed layer (light blocking layer) 62 is formed on the flat plate disposed in front of the display panel 70, and lengthwise slits are formed in the light blocking layer 62. Thus, the light blocking layer 62 is constituted by a peripheral part and lengthwise lines. The spaces between the lengthwise lines may not be slits, and transparent members may be disposed therein. The display panel 70 includes a display region 91 and a peripheral region 92, and a large number of fine color filters 72 are provided in the respective pixels in the display region 91. The color alignment of the color filters 72 is a stripe alignment of three colors: red (R) 72R; green (G) 72G; and blue (B) 72B, each color forms a line. In embodiment 4, the number of the colors, and the number and alignment of the color filters are not limited at all.

Figure 13:
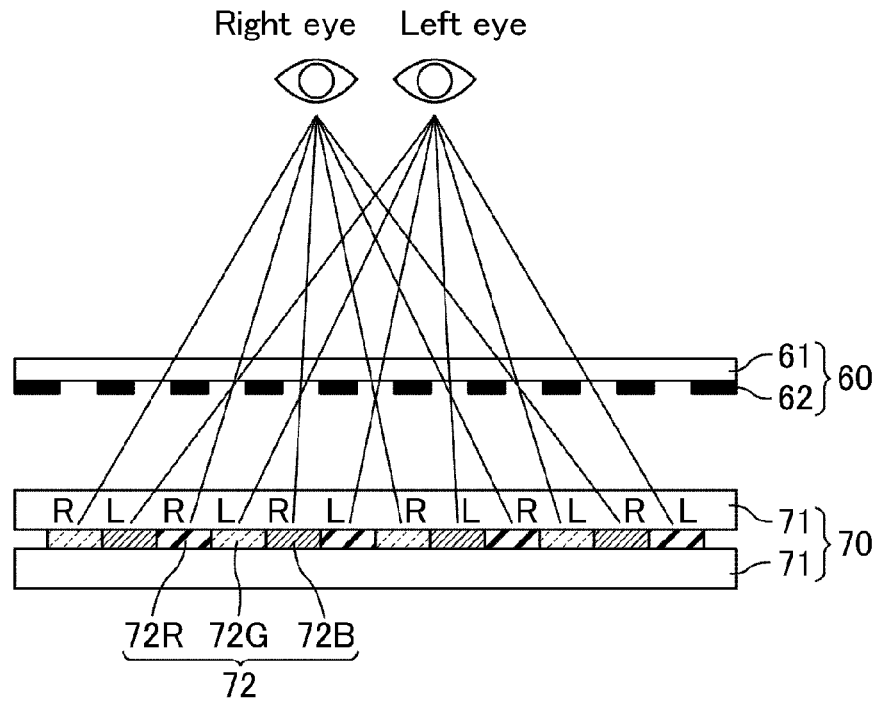
FIG. 13 is a view schematically illustrating a mechanism of a three-dimensional display panel.
Figure 14:
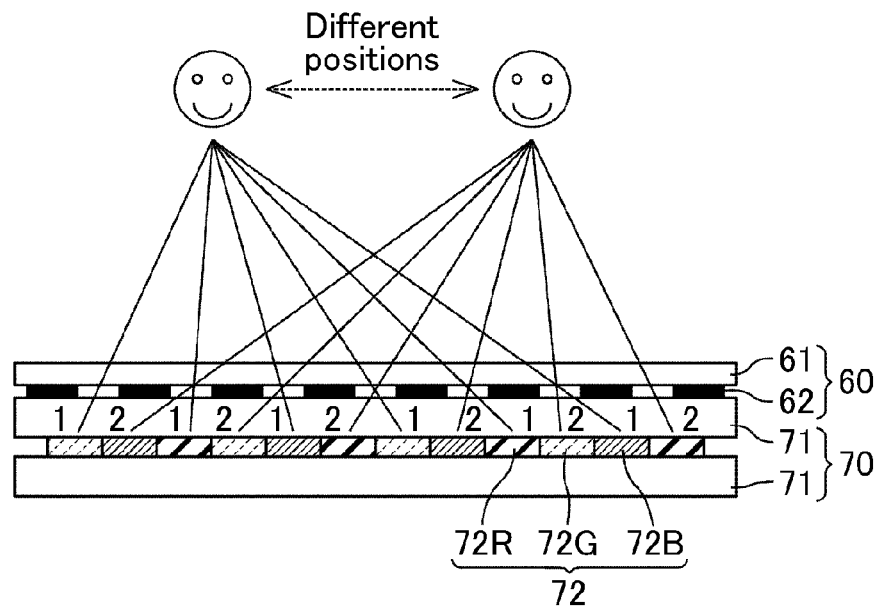
FIG. 14 is a view schematically illustrating a mechanism of production of images that differ with the viewing position.

FIG. 13 is a view schematically illustrating a mechanism of a three-dimensional display panel. FIG. 14 is a view schematically illustrating a mechanism of production of images that differ with the viewing position.

As shown in FIGS. 13 and 14, the flat plate 60 includes a transparent substrate 61 and light blocking layer 62, and the light blocking layer 62 are disposed on the display panel side surface of the transparent substrate 61. The display panel 70 shown in FIG. 14 is a liquid crystal display panel that includes a pair of transparent substrates 71 and a liquid crystal layer between the transparent substrates 71. As shown in FIGS. 13 and 14, a plurality of light blocking layers 62 is located at certain intervals therebetween when viewed in a cross-sectional view. The color filters 72 are disposed between the transparent substrates 71, and may be disposed in front of or behind the liquid crystal layer.

The expression "panel that allows for display of a plurality of images on the display panel at once" herein refers to a panel that enables a viewer to see specific pixels of the display panel from a certain viewing angle but does not allow the viewer to see these pixels from another viewing angle, as shown in FIGS. 13 and 14. In such a panel, a flat plate provided with lines of light blocking parts is disposed on the front or back side of the display panel. For example, three-dimensional panels and panels capable of producing images that change with the position from which the display panel is seen (also referred to as "dual view panels") are categorized as this type.

In order to achieve three-dimensional vision, it is necessary to create a structure capable of producing images that can be recognized from at least two viewing points respectively (with a vergence angle), specifically, a structure that allows the eyes to see an image of pixels (R pixels) for the right eye and an image of pixels (L pixels) for the left eye, respectively. If the image for the right eye is viewed with the left eye, or if the image for the left eye is viewed with the right eye, the image is seen as a double exposure image. To avoid this, the light blocking layer and slits of the three-dimensional display panel enable the eyes to see the pixels for the respective eyes.

FIG. 13 shows the routes of light from the pixels to the eyes. This structure allows each eye to see one image and does not allow the eyes to see the other image for the other eye. In FIG. 13, the pixels R are pixels for the right eye, and the pixels L are pixels for the left eye. The members arranged widthwise at intervals are the lengthwise lines serving as light blocking parts. In order to produce three-dimensional images, the positions of the slits and the light blocking layers 62 are determined considering the distance between the left and right eyes such that the image for the right eye and the image for the left eye are seen by the respective eyes. The distance between slits is substantially twice the pixel width, and the width of the light blocking layers 62 is 100 to 150% of the width of the pixels. Generally, the distance between eyes of human is assumed to be about 60 mm.

An alternative design is that slits are arranged as if they are adjusted to a larger distance between the eyes, as shown in FIG. 14. A display of this design enables a viewer to see a different image from a different position. As shown in FIG. 14, there are first pixels (pixels indicated by "1" in FIG. 14) for producing a first image, and second pixels (pixels indicated by "2" in FIG. 14) for producing a second image in this design, and the distance between the slits and/or the distance between the light blocking parts is adjusted to determine positions from which a different image is seen, in front of the display panel. This type of display mode is also included in the scope of the panel that allows for display of a plurality of images on the display panel at once. In this case, the distance between slits is substantially twice the width of the pixels, and the width of the light blocking layers 62 is 160 to 180% of the width of the pixels.

The example of FIG. 14 does not require a viewer to see the first pixels and the second pixels with the respective eyes unlike three-dimensional imaging. The viewer sees the pixels with both eyes. This means that the viewer at an optimal viewing position sees either the image of the first pixels or the image of the second pixels.

Theoretically, in the case of, for example, a transmissive liquid crystal display panel, the "panel that allows for display of a plurality of images on the display panel at once" may be disposed in front of or behind the display panel. Embodiment 4 is an example with two viewing points, but the number of viewing points may be two or more as long as the same mechanism works.

In embodiment 4, the light blocking layers and slits of the panel, which is disposed in front of (or behind) the display panel having pixels designed to achieve multiple view points, allow light from certain pixels to pass through and block light from certain pixels depending on the viewing position. In embodiment 4, the panel provided with such light blocking layers is attached to the display panel using a resin composition of the present invention. In some designs, the width of light blocking layers having such a function is about 50% to 80% of the width of pixels, and the light blocking layers prevent light emitted from the front (or back) side of the display panel from reaching the areas behind the light blocking layers. Thus, the above-mentioned proportion of the whole resin composition remains uncured.

As shown in FIG. 14, in the panel that allows for display of a plurality of images on the display panel at once, the frame of the lines may be a wide light blocking part. Such a panel may allow only a much smaller area of the resin to be cured by light compared to those used as flat plates for televisions. Therefore, a sufficient level of adhesion strength for attaching the flat plate may not be achieved in some cases. When a flat plate provided with such light blocking parts is attached to a display panel or an intermediate member, the following steps are performed: a primer is applied to or printed onto the undersurface of the light blocking parts; the slits are aligned as described in embodiment 1; the peripheral area (side surfaces) of the resin composition is precured by light; and the whole resin composition is cured by irradiating the entire display region with light from the flat plate side to adhere the flat plate and the display panel or the intermediate member.

In this case, the primer applied to the undersurface of the light blocking parts causes the area of the resin composition hidden behind the light blocking parts to be cured. For example, in the case of a 40-inch high-vision three-dimensional television, the pixel pitch is about 153 µm, the slit width is about 76 to 120 µm, and the number of slits is 5760. In such a case, it is difficult to apply the primer for each line. The primer may be applied by printing using a mask or the like. This, however, requires an additional step such as positioning the mask. In this case, the primer may be applied to the entire flat plate including parts overlapping slits, and the positioning may be performed after attaching the members and before curing. Additionally, in this case, it is preferable to control the curing time by adjusting the primer concentration and the peroxide concentration in advance. In the case that the primer is applied to the entire surface of the flat plate, light irradiation is not necessary, but the area to which the primer is applied may be irradiated with light to avoid a color change of the resin, which is caused by a light absorber dispersed in the resin depending on its absorption wavelength, and therefore to improve the light transmissivity.

Figure 15:
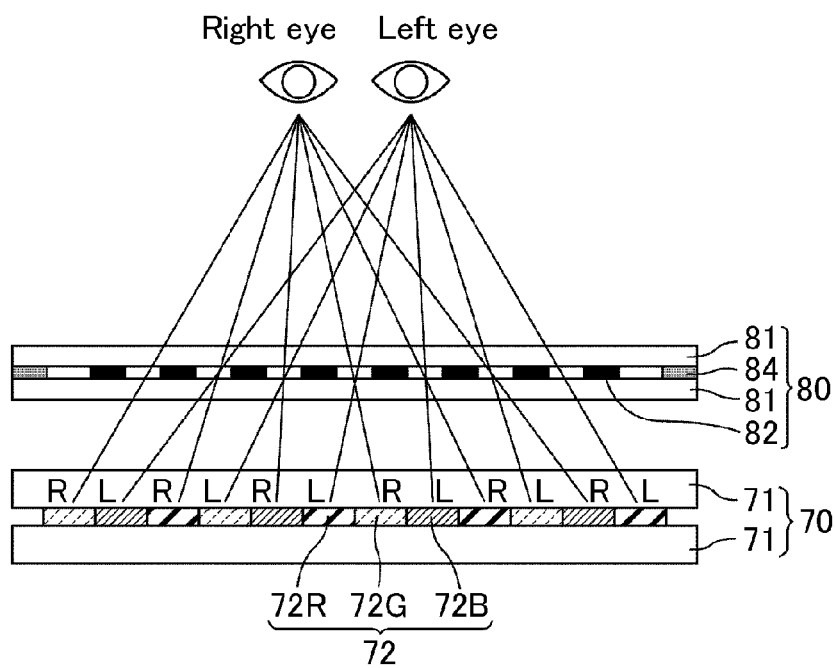
FIG. 15 is a view schematically illustrating a mechanism of another three-dimensional display panel.

FIG. 15 is a view schematically illustrating a mechanism of another three-dimensional display panel. The three-dimensional display panel 80 shown in FIG. 15 is a liquid crystal display panel including a pair of transparent substrates 81 and a liquid crystal layer between the transparent substrates 81. The liquid crystal layer between the transparent substrate 81 is sealed with the seal 84. Additionally, light blocking layers 82 are provided between the transparent substrates 81, and the light blocking layers 82 are located at certain intervals therebetween when viewed in a cross-sectional view.

In some three-dimensional displays, the liquid crystal display panel 80 may be disposed as shown in FIG. 15 to produce three-dimensional images. In these cases, three-dimensional images are produced by adjusting light such that light passing parts and light blocking parts are formed in a stripe pattern. Since light blocking layers are not members actually existing in the display region, the resin composition can be cured with light that is not controlled for three-dimensional imaging. However, the seal 84 adhering the transparent substrates 81 of the liquid crystal display panel 80 is opaque in some cases, and thus, the liquid crystal display panel 80 for three-dimensional imaging may include a light blocking part along the periphery thereof. In such a case, the present invention allows the area that is prevented from being exposed to light by the seal 84 to be cured by applying the primer to the area. This type of three-dimensional display is widely used in mobile devices such as mobile phones, smart phones, and tablet PCs, and the liquid crystal display panel (display device) 70 for displaying images thereon and the liquid crystal display panel (flat plate) 80 for displaying slits (three-dimensional imaging) are attached to each other. The liquid crystal display panel 80 for three-dimensional imaging may be disposed in front of or behind the liquid crystal display panel 70 for displaying images. The above three-dimensional display technique using the above-described liquid crystal display panel allows for three-dimensional imaging viewable with naked eyes.

Additionally, the flat plate is not limited only to three-dimensional liquid crystal display panels as described above, and may be a functional device such as a touch panel. A touch panel as described in embodiment 3 may be disposed between the liquid crystal display panel for displaying images and the liquid crystal display panel for three-dimensional imaging. Thus, the adhesion technique using the resin of the present invention is useful for members including a light blocking part that may prevent an area behind the light blocking part from being photocured.

Evaluation

The following description is offered to illustrate the components and property values of samples prepared using the method of embodiment 1 (combination of photocuring and curing using a primer) as examples of the cured resin layer of embodiment 1. Table 1 shows the compositions of the samples of Examples 1 to 7. Table 2 shows the components and property values of the samples of Examples 1 to 7 and Comparative Example.

TABLE 1

|  | Composition 1 | Composition 2 | Composition 3 | Composition 4 | Composition 5 |
|---|---|---|---|---|---|
| Reactive component (%) | 49% | 49% | 53% | 53% | 50% |
| Oligomer | 43 | 43 | 43 | 43 | 43 |
| Monomer A | 40 | 40 | 40 | 40 | 40 |
| Monomer B | 20 | 20 | 20 | 20 | 20 |
| Monomer C | 10 | 10 | 10 | 10 | 10 |
| Non-reactive component | 43% | 44% | 38% | 38% | 44% |
| Peroxide (%) | 2.0% | 0.04% | 2.5% | 2.5% | 0.0% |
| Peroxide A | 6 | 0.1 | 6 | 0 | 0 |
| Peroxide B | 0 | 0 | 0 | 3 | 0 |
| Photoinitiator | 7.5 | 7.5 | 7.5 | 7.5 | 7.5 |
| Photoinitiator (%) | 5% | 5% | 5% | 5% | 5% |
| Additive (%) | 1.0% | 1.86% | 1.5% | 1.0% | 1.0% |

All percentages "%" are % by mass relative to 100% by mass of the whole resin composition in Table 1. The values for the oligomer, monomer A, monomer B, monomer C, peroxide A, peroxide B, and photopolymerization initiator are the amounts thereof based on part by mass.

In Table 1, the "oligomer" is isoprene methacrylate oligomer (UC-1, KURARAY CO., LTD.), the "monomer A" is dicyclopentenyloxy methacrylate (QM-657, Rohm & Haas Company), the "monomer B" is 2-hydroxybutyl methacrylate (LIGHT ESTER HOB, KYOEISHA Chemical Co., Ltd.), the "monomer C" is isobornyl methacrylate (NK ester IB, Shin Nakamura Chemical Co., Ltd.), the "non-reactive component" is a polybutadiene plasticizer (Poly Oil 110, Degussa), the "peroxide A" is cumene hydroperoxyde (Kayacumene H, Nippon Kayaku Co., Ltd.), the "peroxide B" is tert butyl peroxy-2-ethylhexanoate (PERBUTYL O, NOF CORPORATION), the "photoinitiator" is 1-hydroxycyclohexylo-hexylphenylketone (IRGACURE 184, BASF), and the "additive" is 3-methacryloxypropyltrimethoxysilane (KBM-503, Shin-Etsu Chemical Co., Ltd.).

TABLE 2

| Evaluation | Comparative Example | Example 1 | Example 2 | Example 3 | Example 4 | Example 5 | Example 6 | Example 7 |
|---|---|---|---|---|---|---|---|---|
| Resin | Composition 5 | Composition 3 | Composition 3 | Composition 3 | Composition 3 | Composition 1 | Composition 2 | Composition 4 |
| Primer concentration | — | 1/10 | 1/10 | 1/1 | 1/2 | 1/1 | 1/10 | 1/10 |
| Primer curing time | — | 5 h | 24 h | 24 h | 5 h | 24 h | 24 h | 24 h |

TABLE 2-continued

| Evaluation | Comparative Example | Example 1 | Example 2 | Example 3 | Example 4 | Example 5 | Example 6 | Example 7 |
|---|---|---|---|---|---|---|---|---|
| G' (Pa) after curing using primer | — | 2450 | 11590 | 15200 | 1150 | — | — | — |
| Evaluatation of display streaks | Poor | Good | Good | Good | Good | Good | Good | Good |

The component of the primer of Table 2 is vanadium pentoxide complex. The value 1/1 of the primer concentration means that the primer was not diluted, and refers to a primer (AT QUICKA VE3, TOAGOSEI CO., LTD.), the primer component (vanadium pentoxide complex) concentration of which was 3% by mass of the whole. The value 1/2 of the primer concentration means that the primer was diluted to a 1/2 concentration, and refers to a primer, the primer component concentration of which was 1.5% by mass of the whole. The value 1/10 of the primer concentration means that the primer was diluted to a 1/10 concentration, and refers to a primer, the primer component concentration of which was 0.3% by mass of the whole. The solvent used for dilution was ethanol.

As shown in Table 2, the compositions shown in Table 1 could be prepared into a favorable cured resin layer by the production method of embodiment 1. In contrast, a cured resin layer prepared only by light irradiation from the flat plate side without using a primer (Comparative Example) was not good because it was not sufficiently cured.

Figure 16:
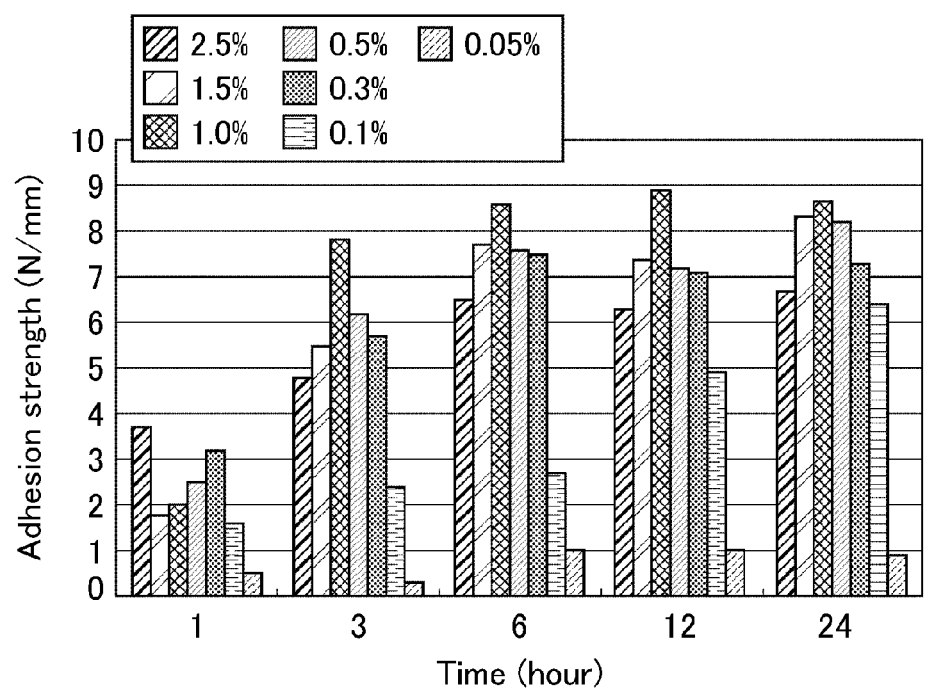
FIG. 16 is a graph of adhesion strength vs. time for the case in which the primer concentration was not diluted.
Figure 17:
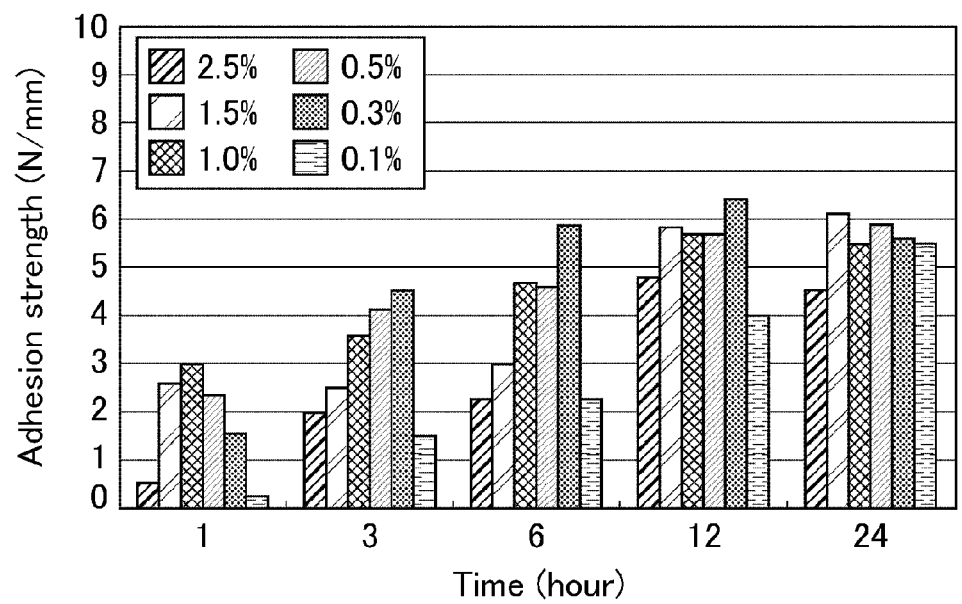
FIG. 17 is a graph of adhesion strength vs. time for the case in which the primer concentration was diluted to 1/10.
Figure 18:
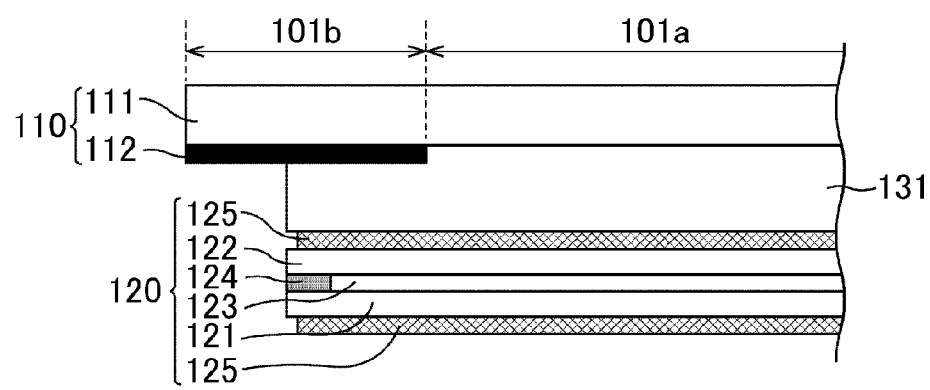
FIG. 18 is a cross-sectional view schematically illustrating a flat plate with a light blocking part and a display panel before light irradiation from the flat plate side.
Figure 19:
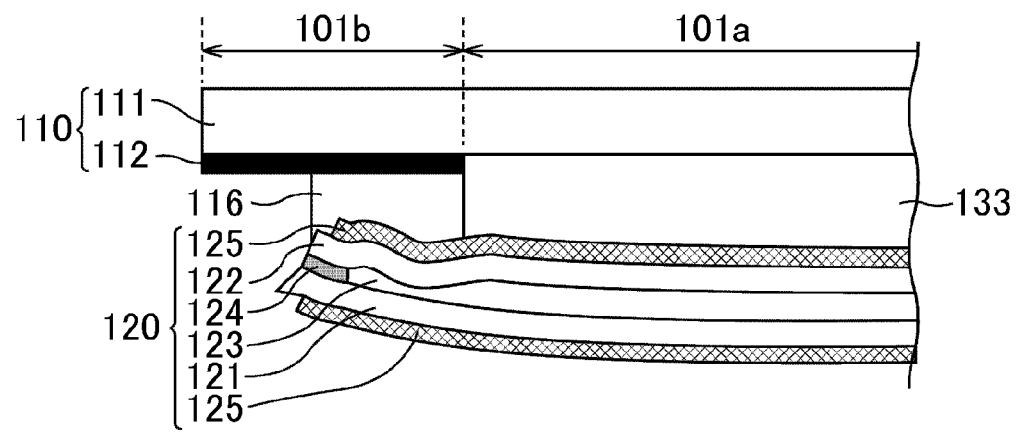
FIG. 19 is a cross-sectional view schematically illustrating the flat plate with a light blocking part and the display panel after light irradiation from the flat plate side.
Figure 20:
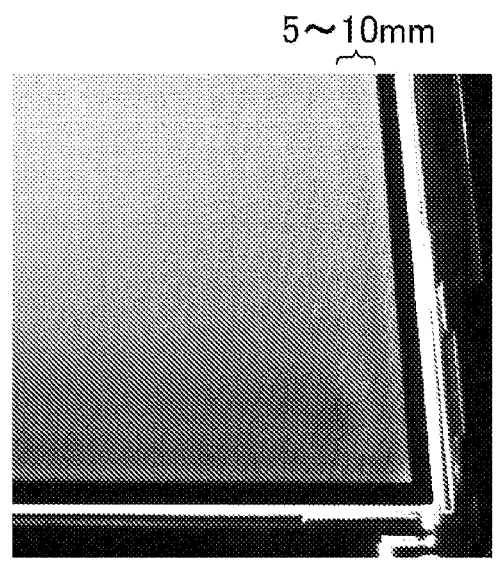
FIG. 20 is a photograph of a liquid crystal display panel with streaks caused by remaining uncured resin.
Figure 21:
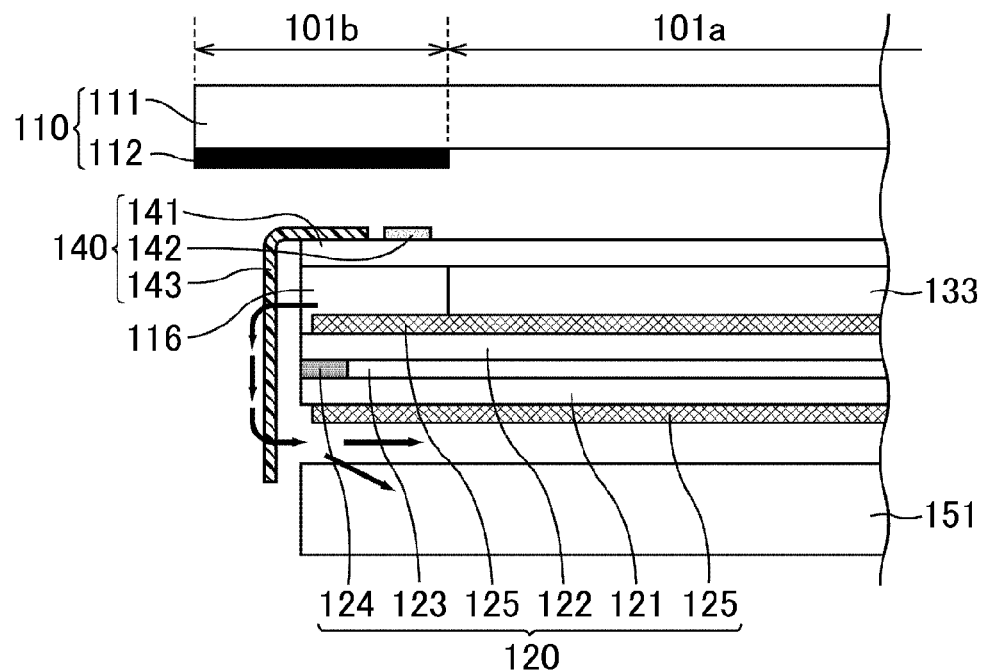
FIG. 21 is a cross-sectional view schematically illustrating a structure in which a touch panel is disposed between a flat plate and a liquid crystal display panel, and an uncured resin area remains.
Figure 22:
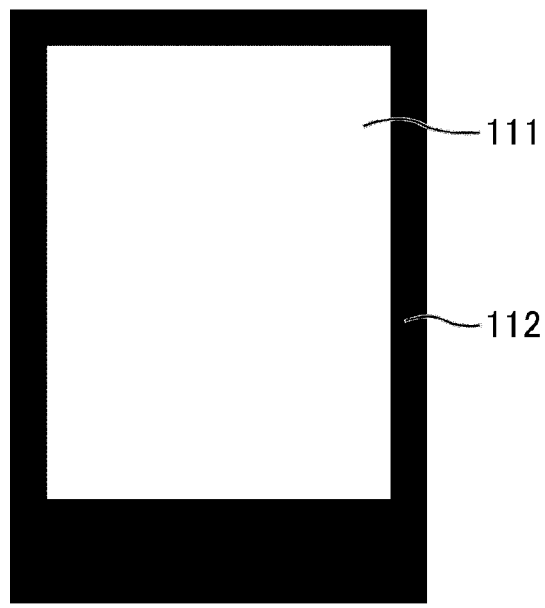
FIG. 22 is a schematic plan view of a front surface of a structure in which a touch panel is disposed between a flat plate and a liquid crystal display panel.
Figure 23:
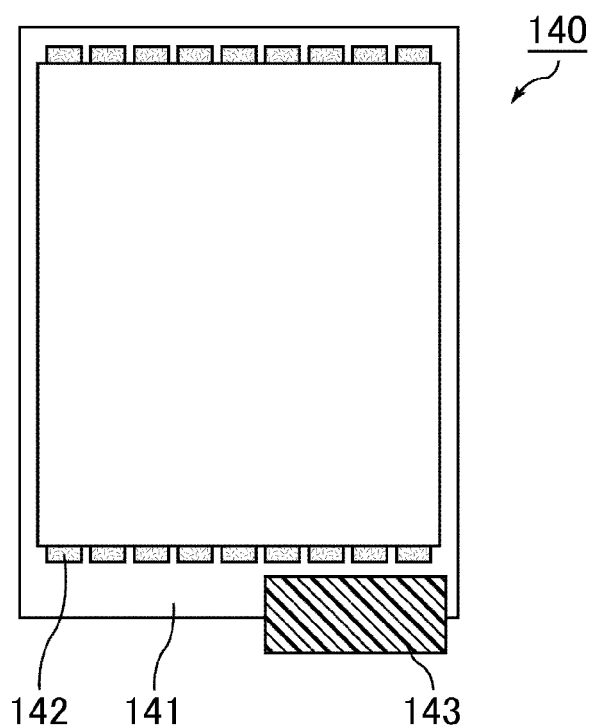
FIG. 23 is a schematic plan view of a surface exposed by removing the light blocking layer of the structure in which the touch panel is disposed between the flat plate and the liquid crystal display panel.

FIGS. 16 and 17 are graphs of adhesion strength vs. time. FIG. 16 shows the results of the case in which the primer concentration was not diluted, and FIG. 17 shows the results of the case in which the primer concentration was diluted to 1/10. The graphs of FIGS. 16 and 17 are based on the data of Tables 3 and 5, respectively. Tables 4 and 6 show the relationship between the reactivity of the peroxide and time. Table 4 shows the results of the case in which the primer concentration was not diluted, and Table 6 shows the results of the case in which the primer concentration was diluted to 1/10. All percentages "%" of the peroxide in Tables 3 to 6 and FIGS. 16 and 17 are % by mass relative to 100% by mass of the whole resin composition.

TABLE 3

| | Adhesion strength (N/mm) | | | | | | |
|---|---|---|---|---|---|---|---|
| | Peroxide (%) | | | | | | |
| Time (h) | 2.5 | 1.5 | 1.0 | 0.5 | 0.3 | 0.1 | 0.05 |
| 1 | 3.7 | 1.8 | 2.0 | 2.5 | 3.2 | 1.6 | 0.5 |
| 3 | 4.8 | 5.5 | 7.8 | 6.2 | 5.7 | 2.4 | 0.3 |
| 6 | 6.5 | 7.7 | 8.6 | 7.6 | 7.5 | 2.7 | 1.0 |
| 12 | 6.3 | 7.4 | 8.9 | 7.2 | 7.1 | 4.9 | 1.0 |
| 24 | 6.7 | 8.3 | 8.7 | 8.2 | 7.3 | 6.4 | 0.9 |

TABLE 4

| | Reactivity (%) | | | | | | |
|---|---|---|---|---|---|---|---|
| | Peroxide (%) | | | | | | |
| Time (h) | 2.5 | 1.5 | 1.0 | 0.5 | 0.3 | 0.1 | 0.05 |
| 1 | 90 | 87 | 91 | 86 | 84 | 74 | 35 |
| 3 | 96 | 97 | 96 | 95 | 92 | 84 | 38 |
| 6 | 96 | 98 | 97 | 96 | 93 | 86 | 41 |
| 12 | 98 | 98 | 98 | 97 | 96 | 87 | 44 |
| 24 | 99 | 98 | 98 | 96 | 96 | 89 | 41 |

Regarding the change of the adhesion strength against the peroxide, the adhesion strength reached saturation after three hours when the peroxide concentration was 0.3% by mass or higher, as shown in Tables 3 and 4. Tables 3 and 4 also reveal that when the peroxide concentration was 1.0% by mass, all the adhesion strength values were highest, and were thus the optimum values. This is presumably associated with dispersion of the primer. When the amount of the peroxide is small (specifically 0.1% by mass or less), the polymerization reaction does not sufficiently proceed due to shortage of the peroxide even though the primer is dispersed. When the amount of the peroxide is excessive (specifically 2.5% by mass or more), the polymerization reaction proceeds before the primer sufficiently disperses due to too much peroxide. Therefore, too much primer is consumed in the initial stage of dispersion, and only a smaller amount of the primer is dispersed widely. The adhesion strength values were regarded as good when they were 4 N/mm or higher.

TABLE 5

| | Adhesion strength (N/mm) | | | | | |
|---|---|---|---|---|---|---|
| | Peroxide (%) | | | | | |
| Time (h) | 2.5 | 1.5 | 1.0 | 0.5 | 0.3 | 0.1 |
| 1 | 0.6 | 2.6 | 3.0 | 2.4 | 1.6 | 0.3 |
| 3 | 2.0 | 2.5 | 3.6 | 4.1 | 4.5 | 1.5 |
| 6 | 2.3 | 3.0 | 4.7 | 4.6 | 5.9 | 2.3 |
| 12 | 4.8 | 5.8 | 5.7 | 5.7 | 6.4 | 4.0 |
| 24 | 4.5 | 6.1 | 5.5 | 5.9 | 5.6 | 5.5 |

TABLE 6

| | Reactivity (%) | | | | | |
|---|---|---|---|---|---|---|
| | Peroxide (%) | | | | | |
| Time (h) | 2.5 | 1.5 | 1.0 | 0.5 | 0.3 | 0.1 |
| 1 | 85 | 81 | 69 | 65 | 64 | 47 |
| 3 | 88 | 86 | 84 | 78 | 84 | 75 |
| 6 | 93 | 95 | 93 | 83 | 84 | 81 |
| 12 | 97 | 95 | 94 | 93 | 92 | 82 |
| 24 | 98 | 95 | 98 | 94 | 96 | 86 |

As shown in Tables 5 and 6, when the primer concentration was diluted to 1/10, the adhesion strength values were lower than those obtained in the case that the concentration was not diluted. The reactivity at the peroxide concentrations of 1.0% by mass or higher exceeded 90% after 6 hours, and the reactivity at the concentration of 0.3% by mass or higher reached 90% or higher after 12 hours. This does not mean that the reaction did not sufficiently proceed, but indicate that slower polymerization results in lower adhesion strength.

Consideration of the results including the results of Tables 3 and 4 as well revealed that there is a relationship between the primer and peroxide concentrations and the starting point of increase in adhesion strength, and some of the combinations are suitable for the starting point of increase in adhesion strength. In the case of no dilution and a peroxide concentration of 0.3% by mass or higher, three hours were enough to provide sufficient adhesion strength. Practically, the time period required to achieve a practical level of adhesion strength is preferably about three hours based on a consideration of the time period for the alignment after the attachment, the interval until the alignment, and the need of peeling in the case that rework becomes necessary after the alignment.

Accordingly, when the primer concentration is not diluted, the curing rate achieved at the peroxide concentration of 2.5% by mass is too high, and may make it impossible to rework.

On the other hand, when the primer concentration is low, specifically diluted to 1/10, the peroxide concentration should be adjusted to 0.3 to 0.5% by mass. If the concentration is out of the range, it takes too long a time to achieve a sufficient adhesion strength, and such a concentration is not suitable for practical production.

Application of the primer can be accomplished with a brush or a dispenser, or by printing or the like. The concentration of the primer is not always uniform over the whole coating, and the peroxide concentration preferably falls within the range of 0.3 to 1.5% by mass, and more preferably 0.3 to 0.5% by mass based on a consideration of dilution to 1/10.

The present application claims priority to Patent Application No. 2011-008175 filed in Japan on Jan. 18, 2011 under the Paris Convention and provisions of national law in a designated State, the entire contents of which are hereby incorporated by reference.

REFERENCE SIGNS LIST 1a, 101a: Light passing part
1b, 101b: Light blocking part
10, 110: Flat plate
11, 61, 71, 81, 111: Transparent substrate
12, 62, 82, 112: Light blocking layer
13: Primer
20, 70, 80, 120: (Liquid crystal) display panel
21, 121: Substrate (active matrix substrate)
22, 122: Substrate (color filter substrate)
23, 123: Liquid crystal layer
24, 84, 124: Seal
25, 125: Polarizer
30: Resin composition
31: Reactive component
32: Peroxide
33: Cured resin layer
33a: Cured resin layer (formed by light irradiation)
33b: Cured resin layer (formed by action of primer)
33c: Cured resin layer (formed by light irradiation)
34: Photopolymerization initiator
40, 140: Touch panel
41, 141: Transparent substrate
42, 142: Peripheral line
43, 143: FPC substrate
51, 151: Back light unit
72: Color filter
72R: Color filter (red)
72G: Color filter (green)
72B: Color filter (blue)
91: Display region
92: Peripheral region
116: Uncured areas
133: Cured resin layer
171: Light source

The invention claimed is:

1. A display panel with a flat plate, comprising:
a flat plate provided with a light passing portion and a light blocking portion;
a display panel; and
an adhesive layer between the flat plate and the display panel, wherein
the adhesive layer is a cured resin layer formed by polymerization involving at least one reactive component selected from the group consisting of a (meth)acrylate oligomer, a bicyclic ring-containing (meth)acrylate monomer, and a hydroxyl group-containing (meth)acrylate monomer, a peroxide component, and a primer as reaction materials, and
the primer is present at a lower concentration in an area of the cured resin layer behind the light passing portion of the flat plate than a concentration in an area of the cured resin layer behind the light blocking portion of the flat plate.

2. The display panel with a flat plate according to claim 1, wherein the adhesive layer is a cured resin layer adhering the flat plate and the display panel.

3. The display panel with a flat plate according to claim 1, wherein an intermediate member is disposed between the flat plate and the display panel, and
the adhesive layer is a cured resin layer adhering the display panel and the intermediate member.

4. The display panel with a flat plate according to claim 3, wherein the intermediate member is a touch panel.

5. The display panel with a flat plate according to claim 1, wherein the primer comprises a metal complex containing at least one element selected from the group consisting of iron, aluminum, cobalt, manganese, tin, zinc, vanadium, chrome, zirconium, indium, and titanium.

6. The display panel with a flat plate according to claim 1, wherein the reactive component comprises all of the (meth)acrylate oligomer, the bicyclic ring-containing (meth)acrylate monomer, and the hydroxyl group-containing (meth)acrylate monomer.

7. The display panel with a flat plate according to claim 1, wherein an area of the cured resin layer behind the light passing portion is formed by polymerization involving the reactive component and a photopolymerization initiator as reaction materials.

8. The display panel with a flat plate according to claim 7, wherein the photopolymerization initiator is present at a lower concentration in the area of the cured resin layer behind the light passing portion of the flat plate than in an area of the cured resin layer behind the light blocking portion of the flat plate.

9. The display panel with a flat plate according to claim 1, wherein the cured resin layer is formed substantially only by polymerization involving the reactive component, the peroxide component, and the primer as reaction materials.

10. The display panel with a flat plate according to claim 1, wherein the cured resin layer has a storage modulus at 25° C. of not less than 1.1 kPa.

11. The display panel with a flat plate according to claim 1, wherein the display panel is a liquid crystal display panel comprising substrates and a liquid crystal layer between the substrates.

12. The display panel with a flat plate according to claim 1, wherein the flat plate is a panel that allows for display of a plurality of images on the display panel at once.

* * * * *